United States Patent
Kurokawa

(10) Patent No.: US 9,494,644 B2
(45) Date of Patent: Nov. 15, 2016

(54) SEMICONDUCTOR DEVICE INCLUDING MEMORY CIRCUIT AND LOGIC ARRAY

(71) Applicant: SEMICONDUCTOR ENERGY LABORATORY CO., LTD., Atsugi-shi, Kanagawa-ken (JP)

(72) Inventor: Yoshiyuki Kurokawa, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 92 days.

(21) Appl. No.: 14/542,859

(22) Filed: Nov. 17, 2014

(65) Prior Publication Data
US 2015/0144948 A1    May 28, 2015

(30) Foreign Application Priority Data
Nov. 22, 2013  (JP) ................. 2013-241608

(51) Int. Cl.
*H01L 29/786* (2006.01)
*G06F 11/36* (2006.01)
(Continued)

(52) U.S. Cl.
CPC ..... *G01R 31/31707* (2013.01); *G01R 31/3187* (2013.01); *H01L 29/7869* (2013.01);
(Continued)

(58) Field of Classification Search
CPC .............. G01R 31/31707; G01R 31/3187; G01R 31/318505; H01L 29/7869; H01L 29/78618; G06F 11/1407; G06F 11/3636
USPC ........................................................ 714/745
See application file for complete search history.

(56) References Cited

U.S. PATENT DOCUMENTS 3,673,573 A * 6/1972 Smith ................. G06F 11/3466
                                                      714/45
5,544,307 A * 8/1996 Maemura ............ G06F 11/3648
                                                      703/26
(Continued)

FOREIGN PATENT DOCUMENTS

EP     1737044 A     12/2006
EP     2226847 A      9/2010
(Continued)

OTHER PUBLICATIONS

Asakuma.N et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.

(Continued)

*Primary Examiner* — James C Kerveros
(74) *Attorney, Agent, or Firm* — Fish & Richardson P.C.

(57) ABSTRACT

A semiconductor device in which the area of a circuit that is unnecessary during normal operation is small. The semiconductor device includes a first circuit and a second circuit. The first circuit includes a third circuit storing at least one pair of first data including a history of a branch instruction and a first address corresponding to the branch instruction; a fourth circuit comparing a second address of an instruction and the first address; and a fifth circuit selecting the first data of one pair among the at least one pair in accordance with a comparison result. The second circuit includes a plurality of sixth circuits having a function of generating a signal for testing operation of the first circuit in accordance with second data, and a function of storing the at least one pair together with the second circuit after the operation is tested.

21 Claims, 15 Drawing Sheets

(51) Int. Cl.
    *G06F 11/14* (2006.01)
    *G01R 31/3187* (2006.01)
    *G01R 31/3185* (2006.01)
    *G01R 31/317* (2006.01)

(52) U.S. Cl.
    CPC ... *G01R31/318508* (2013.01); *G06F 11/1407* (2013.01); *G06F 11/3636* (2013.01); *H01L 29/78618* (2013.01)

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 6,127,702 A | 10/2000 | Yamazaki et al. | |
| 6,294,274 B1 | 9/2001 | Kawazoe et al. | |
| 6,436,741 B2 | 8/2002 | Sato et al. | |
| 6,563,174 B2 | 5/2003 | Kawasaki et al. | |
| 6,601,218 B2 | 7/2003 | Sato et al. | |
| 6,615,402 B2 | 9/2003 | Kaneko et al. | |
| 6,678,645 B1 | 1/2004 | Rajsuman et al. | |
| 6,727,522 B1 * | 4/2004 | Kawasaki | H01L 27/15 257/102 |
| 6,829,735 B1 * | 12/2004 | Aoyama | G06F 9/328 712/E9.015 |
| 6,874,107 B2 | 3/2005 | Lesea | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,245,134 B2 | 7/2007 | Granicher et al. | |
| 7,282,782 B2 * | 10/2007 | Hoffman | H01L 29/7869 257/59 |
| 7,297,977 B2 | 11/2007 | Hoffman et al. | |
| 7,307,433 B2 | 12/2007 | Miller et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 * | 8/2008 | Endo | H01L 21/265 257/288 |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 8,581,610 B2 | 11/2013 | Miller et al. | |
| 8,675,382 B2 | 3/2014 | Kurokawa | |
| 2001/0046027 A1 | 11/2001 | Tai et al. | |
| 2001/0054175 A1 * | 12/2001 | Watanabe | G06F 11/3636 717/128 |
| 2002/0010886 A1 | 1/2002 | Tanaka et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0030056 A1 | 2/2005 | Woo et al. | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0148171 A1 | 6/2010 | Hayashi et al. | |
| 2013/0207170 A1 * | 8/2013 | Kurokawa | H03K 19/17728 257/296 |
| 2013/0285697 A1 | 10/2013 | Kurokawa | |
| 2013/0286757 A1 | 10/2013 | Takemura | |
| 2013/0314124 A1 | 11/2013 | Ikeda et al. | |
| 2013/0321025 A1 | 12/2013 | Kurokawa et al. | |
| 2015/0212906 A1 * | 7/2015 | Gschwind | G06F 11/1474 714/15 |
| 2015/0242280 A1 * | 8/2015 | Busaba | G06F 11/1407 714/13 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-142297 A | 6/1993 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |

(56) References Cited

FOREIGN PATENT DOCUMENTS

| | | |
|---|---|---|
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | WO-2004/114391 | 12/2004 |

OTHER PUBLICATIONS

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Cyrstalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "SPINEL,YbFe2O4, and Yb2Fe3O7 Types of Structures for Compounds in the InO3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IgZO Oxide TFT", SID Digest '08 : SID International Symposium Digest of Technical Papers, May 20, 2008, vol. 39, pp. 625-628.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

(56) References Cited

OTHER PUBLICATIONS

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M et al., "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08: Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Ishii.T et al., "A Poly-Silicon TFT With a Sub-5-nm Thick Channel for Low-Power Gain Cell Memory in Mobile Applications", IEEE Transactions on Electron Devices, Nov. 1, 2004, vol. 51, No. 11, pp. 1805-1810.

Kim.W et al., "An Experimental High-Density DRAM Cell with a Built-in Gain Stage", IEEE Journal of Solid-State Circuits, Aug. 1, 1994, vol. 29, No. 8, pp. 978-981.

Shukuri.S et al., "A Complementary Gain Cell Technology for sub-1 V Supply DRAMs", IEDM 92: Technical Digest of International Devices Meeting, Dec. 13, 1992, pp. 1006-1008.

Shukuri.S et al., "A Semi-Static Complementary Gain Cell Technology for Sub-1 V Supply DRAM's", IEEE Transactions on Electron Devices, Jun. 1, 1994, vol. 41, No. 6, pp. 926-931.

\* cited by examiner

SEMICONDUCTOR DEVICE INCLUDING MEMORY CIRCUIT AND LOGIC ARRAY

BACKGROUND OF THE INVENTION

1. Field of the Invention

The present invention relates to an object, a method, or a manufacturing method. In addition, the present invention relates to a process, a machine, manufacture, or a composition of matter. In particular, one embodiment of the present invention relates to a semiconductor device, a display device, a light-emitting device, a power storage device, a memory device, a driving method thereof, or a manufacturing method thereof. For example, the present invention relates to a semiconductor device including a test circuit.

2. Description of the Related Art

A built-in self-test (BIST) is a test technique for providing a function of a tester, which is semiconductor test equipment, in an integrated circuit. It is known that the use of the BIST cuts the costs required for an operation test of a semiconductor device and increases the speed of the operation test. Patent Document 1 discloses a technique for achieving a self-test (BIST) circuit by using a field-programmable gate array (FPGA).

REFERENCE

Patent Document 1: Japanese Published Patent Application No. H5-142297

SUMMARY OF THE INVENTION

To improve the quality of an operation test with the BIST or to perform an operation test on a semiconductor device with complicated functions, a wide variety of test patterns are required to be prepared. As the number and kind of test patterns to be generated increase, the size of a circuit having a function of generating test patterns (hereinafter referred to as BIST circuit) increases, and the area overhead of a semiconductor device including the BIST circuit and a circuit to be tested is likely to increase.

Since test patterns to be generated in the BIST circuit are set in the design phase, a new test pattern is required to be supplied from the outside of the semiconductor device to perform an additional operation test. In this case, advantages of the BIST, such as a higher-speed operation test and lower cost for the operation test, are not obtained.

Branch prediction is a method in which whether a branch condition of a branch instruction is satisfied or not is predicted in advance, and based on the prediction, an instruction predicted to be executed next is executed speculatively before satisfaction of the branch condition is determined. When the accuracy of branch prediction can be increased, a branch hazard in pipelining can be prevented, resulting in higher performance of a processor.

In view of the foregoing technical background, an object of one embodiment of the present invention is to provide a semiconductor device in which the area of a circuit that is unnecessary during normal operation is small. Another object of one embodiment of the present invention is to provide a semiconductor device capable of generating a new test pattern after the design phase. Another object of one embodiment of the present invention is to provide a semiconductor device with high accuracy of branch prediction.

An object of one embodiment of the present invention is to provide a novel semiconductor device or the like. Note that the description of these objects does not disturb the existence of other objects. In one embodiment of the present invention, there is no need to achieve all the objects. Other objects will be apparent from and can be derived from the description of the specification, the drawings, the claims, and the like.

A semiconductor device of one embodiment of the present invention includes a first circuit and a second circuit. The first circuit includes a third circuit storing at least one pair of first data including a history of whether a branch condition of a branch instruction is satisfied or not, and a first address corresponding to the branch instruction; a fourth circuit comparing a second address of an instruction and the first address; and a fifth circuit selecting the first data of one pair among the at least one pair in accordance with a comparison result. The second circuit includes a plurality of sixth circuits with a function of generating a signal for testing operation of the first circuit when electrical continuity between the sixth circuits and a logical value of an output signal with respect to that of an input signal are controlled in accordance with second data, and a function of storing the at least one pair together with the second circuit after the operation is tested in accordance with the signal.

A semiconductor device of one embodiment of the present invention includes a first circuit and a second circuit. The first circuit includes a third circuit storing at least one pair of first data including a history of whether a branch condition of a branch instruction is satisfied or not, and a first address corresponding to the branch instruction; a fourth circuit comparing a second address of an instruction and the first address; and a fifth circuit selecting the first data of one pair among the at least one pair in accordance with a comparison result. The second circuit includes a sixth circuit storing second data; and a plurality of seventh circuits generating a signal for testing operation of the first circuit when electrical continuity between the seventh circuits is controlled by the sixth circuit in accordance with the second data. The sixth circuit has a function of storing the at least one pair together with the second circuit after the operation is tested in accordance with the signal.

In the semiconductor device of one embodiment of the present invention, the sixth circuit may include a plurality of pairs each including a first transistor and a second transistor that is turned on and off in accordance with the second data input through the first transistor.

In the semiconductor device of one embodiment of the present invention, the first transistor may include an oxide semiconductor film including a channel formation region.

In the semiconductor device of one embodiment of the present invention, the oxide semiconductor film may contain In, Ga, and Zn.

One embodiment of the present invention can provide a semiconductor device in which the area of a circuit that is unnecessary during normal operation is small. Another embodiment of the present invention can provide a semiconductor device capable of generating a new test pattern after the design phase. Another embodiment of the present invention can provide a semiconductor device with high accuracy of branch prediction.

One embodiment of the present invention can provide a novel semiconductor device or the like. Note that the description of these effects does not disturb the existence of other effects. One embodiment of the present invention does not necessarily achieve all the above effects. Other effects will be apparent from and can be derived from the description of the specification, the drawings, the claims, and the like.

BRIEF DESCRIPTION OF THE DRAWINGS

In the accompanying drawings.

DETAILED DESCRIPTION OF THE INVENTION

Figure 1:
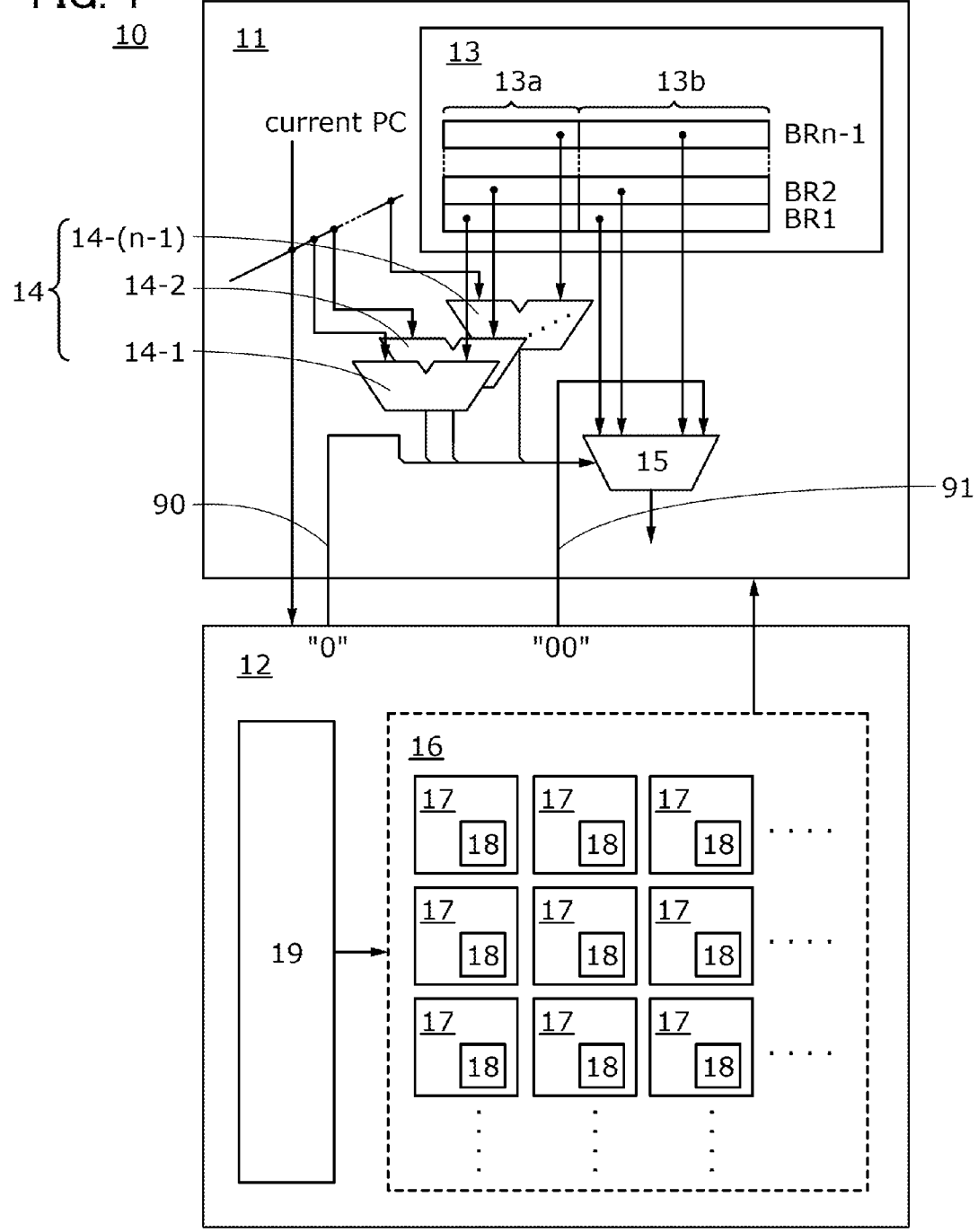
FIG. 1 illustrates a structure of a semiconductor device.

Embodiments of the present invention will be described below in detail with reference to the drawings. Note that the present invention is not limited to the following description, and it is easily understood by those skilled in the art that the mode and details can be variously changed without departing from the spirit and scope of the present invention. Therefore, the present invention should not be construed as being limited to the description of the embodiments below.

Note that the present invention includes, in its category, any semiconductor device including semiconductor integrated circuit, such as RF tags and semiconductor display devices. A semiconductor display device includes, in its category, semiconductor display devices in which a semiconductor integrated circuit is included in a driver circuit, such as liquid crystal display devices, light-emitting devices in which a light-emitting element typified by an organic light-emitting element is provided in each pixel, electronic paper, digital micromirror devices (DMD), plasma display panels (PDP), and field emission displays (FED).

Note that the term "connection" in this specification refers to electrical connection and corresponds to a configuration in which current, voltage, or potential can be supplied or transmitted. Therefore, a configuration in which two circuits or two elements are connected does not necessarily refer to a configuration in which they are directly connected, and also refers to a configuration in which they are indirectly connected through an element such as a wiring, a resistor, a diode, or transistor so that current, voltage, or potential can be supplied or transmitted. In addition, even when different components are connected to each other in a circuit diagram, there is actually a case where one conductive film has functions of a plurality of components, such as a case where part of a wiring serves as an electrode. The term "connection" in this specification also means such a case where one conductive film has functions of a plurality of components.

A source of a transistor means a source region that is part of a semiconductor film functioning as an active layer or a source electrode electrically connected to the semiconductor film. Similarly, a drain of a transistor means a drain region that is part of a semiconductor film functioning as an active layer or a drain electrode electrically connected to the semiconductor film. A gate means a gate electrode.

The terms "source" and "drain" of a transistor interchange with each other depending on the type of the channel of the transistor or the levels of potentials applied to the terminals. In general, in an n-channel transistor, a terminal to which a lower potential is applied is called a source, and a terminal to which a higher potential is applied is called a drain. Furthermore, in a p-channel transistor, a terminal to which a lower potential is applied is called a drain, and a terminal to which a higher potential is applied is called a source. In this specification, the connection relation of the transistor is described assuming that the source and the drain are fixed in some cases for convenience; actually, the names of the source and the drain interchange with each other depending on the relation of the potentials.

Structural Example 1 of Semiconductor Device

FIG. 1 illustrates a structural example of a semiconductor device 10 of one embodiment of the present invention. The semiconductor device 10 illustrated in FIG. 1 includes an integrated circuit 11 and an integrated circuit 12. The integrated circuit 11 includes a variety of logic circuits such as a sequential circuit and a combinational circuit. Each of the integrated circuits 11 and 12 includes at least two transistors, and they can be referred to as a first circuit, a second circuit, and the like or simply circuits.

The integrated circuit 11 includes a memory circuit 13, a comparator circuit 14, and a selector circuit 15. The memory circuit 13 includes a region for storing at least one pair of first data and a first address. The first data includes a history or a prediction of whether a branch condition of a branch instruction is satisfied, and the first address corresponds to the branch instruction. Specifically, FIG. 1 illustrates that the memory circuit 13 includes a first memory region 13a and a second memory region 13b, the first address is stored in the first memory region 13a, and the first data is stored in the second memory region 13b. In FIG. 1, the memory circuit 13 stores n−1 pairs BR of the first data and the first address, represented as the pairs BR1 to BRn−1 (n−1 is an integer).

As the memory circuit 13, a flip-flop, a register, or an SRAM can be used, for example. When the data capacity of the second memory region 13b for storing one pair BR is 2 bits, for example, the state is changed depending on whether a branch condition is satisfied or not between a first state where branch is least likely to be executed (strongly not taken ("00")), a second state where branch is less likely to be executed (weakly not taken ("01")), a third state where branch is more likely to be executed (weakly taken ("10")), and a fourth state where branch is most likely to be executed (strongly taken ("11")). Thus, the second memory region 13b can store a history of whether the branch condition of a branch instruction is satisfied or not.

Specifically, when the branch condition is satisfied, the state is transferred toward strongly taken. On the other hand, when the branch condition is not satisfied, the state is transferred toward strongly not taken. It can be predicted that a branch instruction by which branch conditions have been satisfied successively has a higher probability of satisfying a branch condition next; consequently, the above structure can increase the probability of predicting whether a branch condition of the branch instruction is satisfied or not.

Then, when the history corresponding to the branch instruction is the first state (strongly not taken ("00")) or the second state (weakly not taken ("01")), it can be predicted that the branch condition will not be satisfied. In contrast, when the history corresponding to the branch instruction is the third state (weakly taken ("10")) or the fourth state (strongly taken ("11")), it can be predicted that the branch condition will be satisfied. When the branch condition is predicted to be satisfied, the semiconductor device 10 performs speculative execution.

Note that the data capacity of the second memory region 13b for storing one pair BR may be 1 bit or 3 bits or more.

Memory circuits such as the memory circuit 13 may have another function as well as a function of storing data, for example, and are thus referred to as a first circuit, a second circuit, and the like or simply circuits in some cases.

The comparator circuit 14 has a function of comparing the first address and a second address (current PC) corresponding to an address of an instruction to be executed next. Specifically, FIG. 1 illustrates that the integrated circuit 11 includes n−1 comparator circuits 14 (comparator circuits 14-1 to 14-(n−1)). The comparator circuits 14-1 to 14-(n−1) correspond to the n−1 pairs BR stored in the memory circuit 13. The n−1 comparator circuits 14 have a function of comparing the second address and the corresponding n−1 first addresses included in the n−1 pairs BR.

Comparator circuits such as the comparator circuit 14 may have another function in addition to a function of comparing addresses and data, for example, and are thus referred to as a first circuit, a second circuit, and the like or simply circuits in some cases.

The selector circuit 15 has a function of selecting the first data included in one pair BR among the n−1 pairs BR in accordance with the results of the comparison in the comparator circuits 14. As the selector circuit 15, a multiplexer or the like can be used. For example, when the first address and the second address that are compared in the comparator circuit 14-i (i is a natural number of n−1 or less) among the n−1 comparator circuits 14 are matched, the selector circuit 15 selects the first data included in the pair BRi.

Selector circuits such as the selector circuit 15 may have another function in addition to a function of selecting data, for example, and are thus referred to as a first circuit, a second circuit, and the like or simply circuits in some cases.

Note that a signal including the results of comparison in the comparator circuits 14 as information can also be generated by a circuit different from the selector circuit 15, for example, an OR circuit.

When the comparison results show no match between all the first addresses and the second address, the selector circuit 15 outputs a signal including information about address mismatch.

The integrated circuit 12 includes a logic array 16 and a memory circuit 19. The logic array 16 includes a plurality of circuits 17. Each of the circuits 17 includes a memory circuit 18 with a function of maintaining an input signal. As the memory circuit 18, a sequential circuit such as a flip-flop or a counter can be used, for example.

The memory circuit 19 has a function of storing second data including information on a circuit composed of the circuits 17. Specifically, the second data includes, as circuit information, electrical continuity between the circuits 17 and the logical value of an output signal with respect to that of an input signal in each circuit 17. Furthermore, the memory circuit 19 may have a function of controlling electrical continuity between the circuits 17 in accordance with the second data.

The circuits 17 are provided with a function of generating a signal for testing the operating state of the integrated circuit 11 (hereinafter referred to as test pattern) by controlling electrical continuity between the circuits 17 and the logical value of an output signal with respect to that of an input signal in each circuit 17 in accordance with the second data stored in the memory circuit 19.

The integrated circuit 11 operates in accordance with a test pattern generated in the integrated circuit 12 and outputs a signal accordingly. In the semiconductor device 10 of one embodiment of the present invention, a function of evaluating the operating state of the integrated circuit 11 by using the output signal may be added to the circuits 17 depending on the second data stored in the memory circuit 19.

In one embodiment of the present invention, electrical continuity between the circuits 17 and the logical value of an output signal with respect to that of an input signal in each circuit 17 are controlled in the integrated circuit 12, whereby kinds of test patterns generated in the circuits 17 can be changed. The circuits 17 can function as combinational circuits and sequential circuits, resulting in a wide variety of combinations of the logical values of output signals with respect to those of input signals in the circuits 17. Thus, in the semiconductor device 10 of one embodiment of the present invention, kinds of test patterns generated in the circuits 17 can be increased with a smaller number of gates of the circuits 17. Moreover, an additional test for the operating state of the integrated circuit 11 can be performed without supply of a new test pattern from the outside of the semiconductor device 10.

A test pattern generated in the circuits 17 may be a signal for testing the operating state of some of the circuits included in the integrated circuit 11 or a signal for testing the operating state of the entire integrated circuit 11. For example, when the integrated circuit 11 includes a memory circuit different from the memory circuit 13, the circuits 17 can generate a test pattern for testing the operating state of the memory circuit. When the integrated circuit 11 includes an analog circuit such as a phase locked loop, the circuits 17 can generate a test pattern for testing the operating state of the analog circuit.

Figure 2:
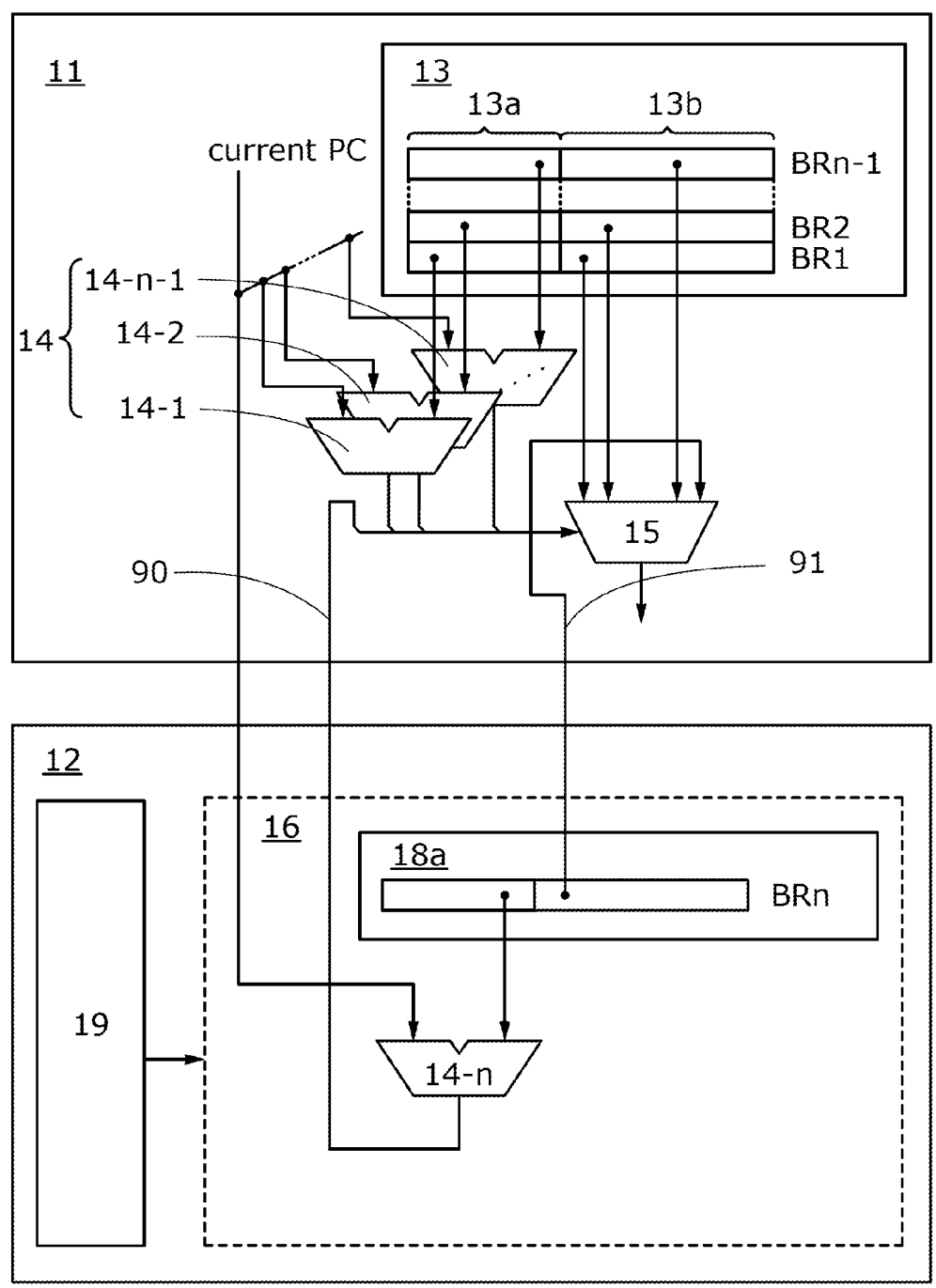
FIG. 2 illustrates a structure of a semiconductor device.

In one embodiment of the present invention, when a test for the operating state of the integrated circuit 11 is not performed, that is, when the semiconductor device 10 is in normal operation, the integrated circuit 12 has a function of storing at least one pair BR of the first data and the first address in the memory circuit 18 or the memory circuit 19. FIG. 2 schematically illustrates an operating state of the semiconductor device 10 in which the memory circuit 18 has a function of storing at least one pair BR of the first data and the first address during normal operation.

FIG. 2 illustrates an example where a function of storing a pair BRn of the first data and the first address is added to the memory circuit 18 by controlling electrical continuity between the circuits 17 in FIG. 1 and the logical value of an output signal with respect to that of an input signal in each circuit 17 in the logic array 16. In FIG. 2, the memory circuit 18 with a function of storing the pair BRn among the plurality of memory circuits 18 is shown as a memory circuit 18a.

Moreover, FIG. 2 illustrates the case where a function of the comparator circuit 14-n is added to any of the circuits 17 by controlling electrical continuity between the circuits 17 and the logical value of an output signal with respect to that of an input signal in each circuit 17 in the logic array 16. Specifically, the comparator circuit 14-n has a function of comparing the second address and the first address included in the pair BRn.

In the semiconductor device 10 in FIG. 2, the selector circuit 15 has a function of selecting the first data included in one pair BR among the n pairs BR in accordance with the results of the comparison in the comparator circuits 14-1 to 14-*n*. For example, when the first address and the second address that are compared in the comparator circuit 14-*j* (j is a natural number of n or less) among the comparator circuits 14-1 to 14-*n* are matched, the selector circuit 15 selects the first data included in the pair BRj. When the comparison results in all the comparator circuits 14-1 to 14-*n* show no match between the first addresses and the second address, the selector circuit 15 outputs a signal including information about address mismatch.

When a test for the operating state of the integrated circuit 11 is performed as illustrated in FIG. 1, data "0" indicating that the first address in the pair BRn stored in the memory circuit 18*a* in FIG. 2 does not match the second address is transmitted from the integrated circuit 12 to the selector circuit 15 through a signal line 90. At this time, if the first address in the pair BRn stored in the memory circuit 18*a* in FIG. 2 is transmitted from the integrated circuit 12 to the selector circuit 15 through a signal line 91, the first data in the pair BRn is not selected in the selector circuit 15.

Alternatively, in order not to select the first data in the pair BRn by the selector circuit 15 during a test for the operating state of the integrated circuit 11, identification information showing that all data stored in the memory circuits 18 are invalid may be input from the integrated circuit 12 to the integrated circuit 11.

FIG. 2 illustrates the example where a function of storing one pair BRn is added to one of the memory circuits 18 and a function of one comparator circuit 14-*n* is added to one of the circuits 17. Alternatively, in the semiconductor device 10 of one embodiment of the present invention, it is possible that a function of storing a plurality of pairs BR is added to the memory circuits 18 and a function of a plurality of comparator circuits 14 corresponding to the pairs BR is added to one of the circuits 17.

FIG. 2 illustrates the example where a function of the comparator circuit 14-*n* is added to one of the circuits 17 in such a manner that the logic array 16 controls electrical continuity between the circuits 17 and the logical value of an output signal with respect to that of an input signal in each circuit 17. Alternatively, in the semiconductor device 10 of one embodiment of the present invention, the integrated circuit 12 may include the comparator circuit 14-*n* in addition to the logic array 16.

A first state where the integrated circuit 12 can generate a test pattern and a second state where the integrated circuit 12 has a function of storing the pair BR can be switched in accordance with an instruction input from an input device (not shown). Alternatively, it is possible that an instruction to switch between these states is stored in a memory device (not shown) included in the integrated circuit 11 and the state is switched in accordance with the instruction when the semiconductor device 10 is powered on.

Switching of a signal path due to the state switching may be performed by a switch (not shown).

In one embodiment of the present invention, the pair BR of the first data and the first address is stored in the memory circuit 18 as well as in the memory circuit 13, whereby the semiconductor device 10 can store a larger number of pairs of the first data including a history of whether a branch condition of a branch instruction is satisfied or not and the first address corresponding to the branch instruction. With this structure, the probability of predicting whether a branch condition of a branch instruction is satisfied or not can be increased even when more complicated pipelining is required; thus, the performance of the semiconductor device can be increased. Accordingly, in the semiconductor device 10 of one embodiment of the present invention, the memory circuit 18 is used not only in a test for the operating state of the integrated circuit 11 but also in normal operation to drive the semiconductor device 10. Thus, the area of a circuit that is unnecessary during normal operation can be reduced in the semiconductor device 10 of one embodiment of the present invention.

Structural Example 2 of Semiconductor Device

Figure 3:
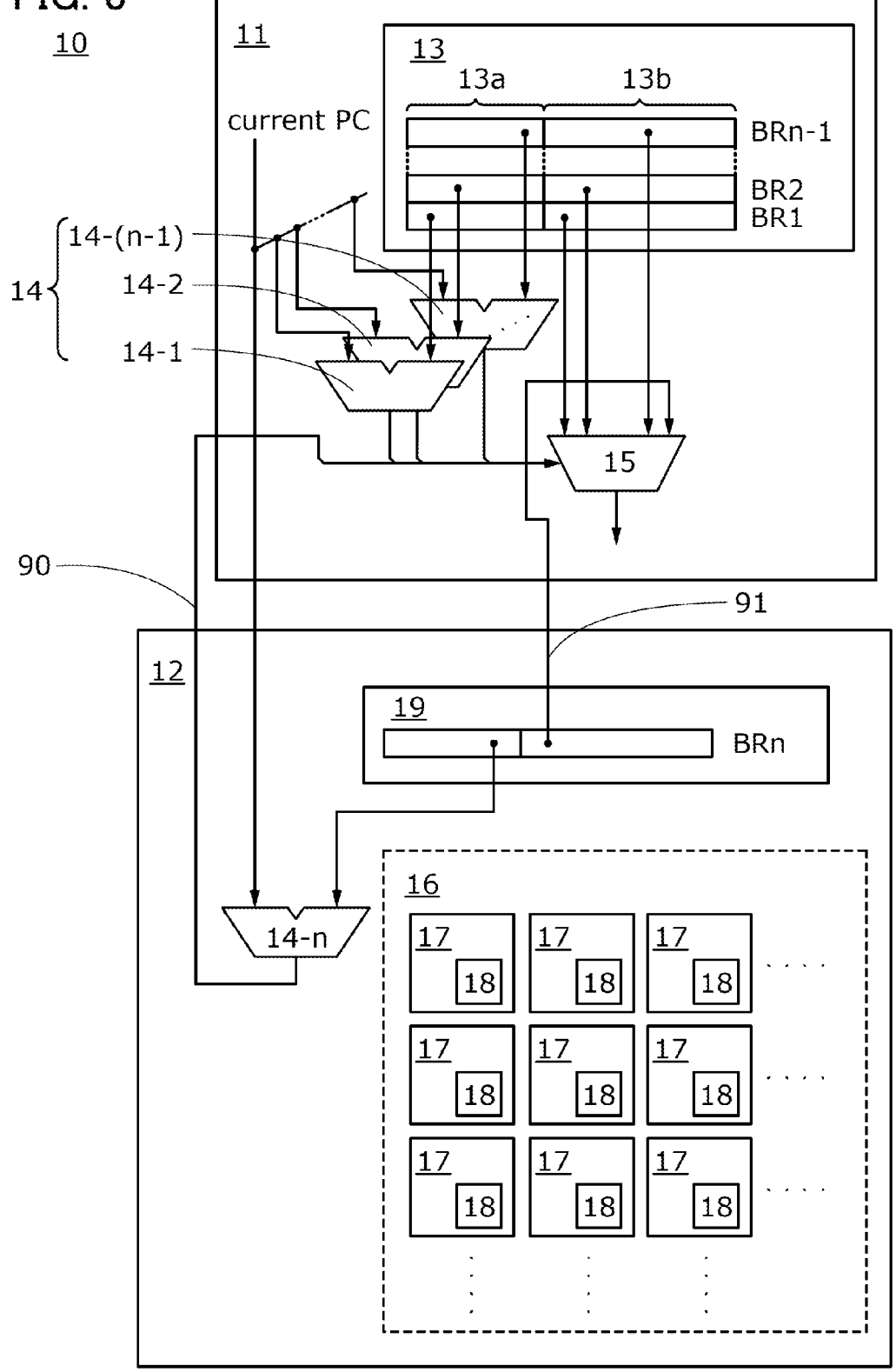
FIG. 3 illustrates a structure of a semiconductor device.

FIG. 3 schematically illustrates an operating state of the semiconductor device 10 in which the memory circuit 19 has a function of storing at least one pair BR of the first data and the first address during normal operation.

Specifically, FIG. 3 illustrates an example where a function of storing the pair BRn of the first data and the first address is added to the memory circuit 19 and the integrated circuit 12 includes the comparator circuit 14-*n*. The comparator circuit 14-*n* has a function of comparing the first address included in the pair BRn and the second address corresponding to an instruction to be executed next.

In the semiconductor device 10 in FIG. 3, the selector circuit 15 has a function of selecting the first data included in one pair BR among the n pairs BR in accordance with the results of comparison in the comparator circuits 14-1 to 14-*n*. For example, when the first address and the second address that are compared in the comparator circuit 14-*j* among the comparator circuits 14-1 to 14-*n* are matched, the selector circuit 15 selects the first data included in the pair BRj. When the comparison results in all the comparator circuits 14-1 to 14-*n* show no match between the first addresses and the second address, the selector circuit 15 outputs a signal including information about address mismatch.

When a test for the operating state of the integrated circuit 11 is performed as illustrated in FIG. 1, data "0" indicating that the first address in the pair BRn stored in the memory circuit 19 in FIG. 3 does not match the second address is transmitted from the integrated circuit 12 to the selector circuit 15 through the signal line 90. At this time, if the first address in the pair BRn stored in the memory circuit 19 in FIG. 3 is transmitted from the integrated circuit 12 to the selector circuit 15 through the signal line 91, the first data in the pair BRn is not selected in the selector circuit 15.

Alternatively, in order not to select the first data in the pair BRn by the selector circuit 15 during a test for the operating state of the integrated circuit 11, identification information showing that all data stored in the memory circuit 19 is invalid may be input from the integrated circuit 12 to the integrated circuit 11.

FIG. 3 illustrates the example where a function of storing one pair BRn is added to the memory circuit 19 and the integrated circuit 12 includes one comparator circuit 14-*n*. Alternatively, in the semiconductor device 10 of one embodiment of the present invention, it is possible that a function of storing a plurality of pairs BR is added to the memory circuit 19 and the integrated circuit 12 includes a plurality of comparator circuits 14 corresponding to the pairs BR.

The first state where the integrated circuit 12 can generate a test pattern and the second state where the integrated circuit 12 has a function of storing the pair BR can be switched in accordance with an instruction input from an input device (not shown). Alternatively, it is possible that an instruction to switch between these states is stored in a memory device (not shown) included in the integrated circuit 11 and the state is switched in accordance with the instruction when the semiconductor device 10 is powered on.

Switching of a signal path due to the state switching may be performed by a switch (not shown).

In one embodiment of the present invention, the pair BR of the first data and the first address is stored in the memory circuit 19 as well as in the memory circuit 13, whereby the semiconductor device 10 can store a larger number of pairs of the first data including a history of whether a branch condition of a branch instruction is satisfied or not and the first address corresponding to the branch instruction. With this structure, the probability of predicting whether a branch condition of a branch instruction is satisfied or not can be increased even when more complicated pipelining is required; thus, the performance of the semiconductor device can be increased. Accordingly, in the semiconductor device 10 of one embodiment of the present invention, the memory circuit 19 is used not only in a test for the operating state of the integrated circuit 11 but also in normal operation to drive the semiconductor device 10. Thus, the area of a circuit that is unnecessary during normal operation can be reduced in the semiconductor device 10 of one embodiment of the present invention.

Structural Examples of Circuit 17

Next, structural examples of the circuit 17 included in the integrated circuit 12 will be described.

Figure 4A:
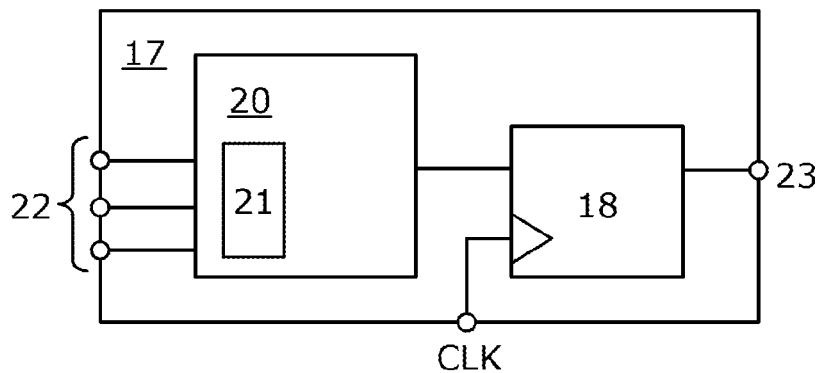
FIGS. 4A to 4C each illustrate a specific structural example of a circuit 17.

FIG. 4A illustrates one embodiment of the circuit 17. The circuit 17 in FIG. 4A includes a lookup table (LUT) 20 and the memory circuit 18. The LUT 20 includes a memory circuit 21 having a function of temporarily storing the second data transmitted from the memory circuit 19. The logical value of an output signal of the LUT 20 with respect to that of an input signal input to an input terminal 22 is determined in accordance with the second data. The memory circuit 18 holds data included in the output signal of the LUT 20 and outputs an output signal corresponding to the data from an output terminal 23 in synchronization with a signal CLK.

Note that it is possible that the circuit 17 includes a multiplexer between the LUT 20 and the memory circuit 18 and whether the output signal from the LUT 20 passes through the memory circuit 18 or not is selected by the multiplexer.

The type of the memory circuit 18 may be defined by data including circuit information. Specifically, the memory circuit 18 may function as any of a D flip-flop, a T flip-flop, a JK flip-flop, and an RS flip-flop in accordance with data including circuit information.

Figure 4B:
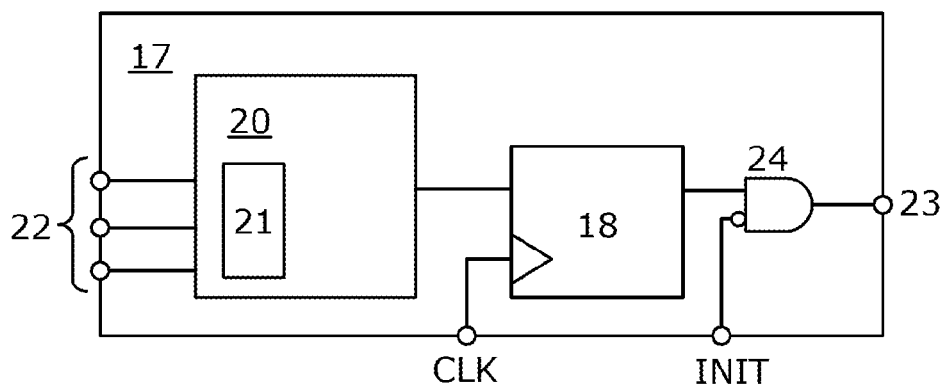

FIG. 4B illustrates another embodiment of the circuit 17. The circuit 17 illustrated in FIG. 4B includes an AND circuit 24 in addition to the components of the circuit 17 illustrated in FIG. 4A. To the AND circuit 24, a signal from the memory circuit 18 is supplied as a positive logic input, and a potential of a signal NIT is supplied as a negative logic input. Thus, the potential of the output terminal 23 can be initialized in accordance with the potential of the signal NIT.

Figure 4C:
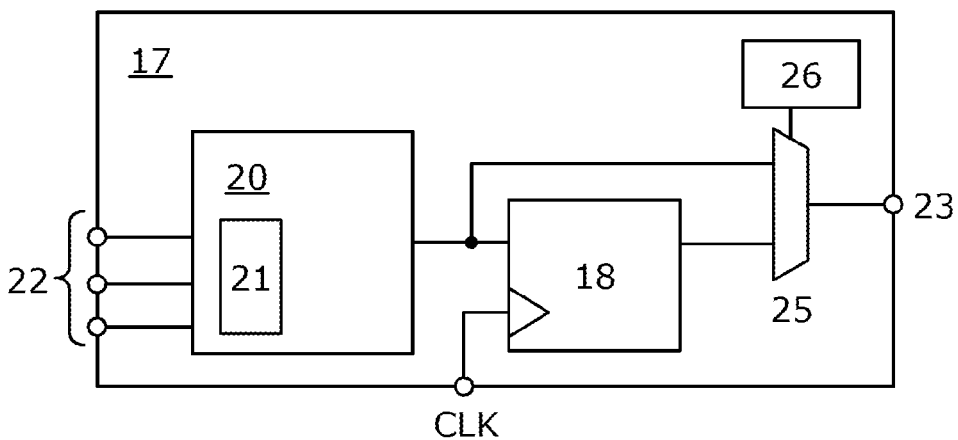

FIG. 4C illustrates another embodiment of the circuit 17. The circuit 17 illustrated in FIG. 4C includes a multiplexer 25 in addition to the components of the circuit 17 illustrated in FIG. 4A. The circuit in FIG. 4C also includes a memory circuit 26 that has a function of storing data for determining the logical value of an output signal with respect to that of an input signal of the multiplexer 25.

The logical value of an output signal with respect to that of an input signal of the LUT 20 is determined in accordance with the second data included in the memory circuit 21. An output signal from the LUT 20 and an output signal from the memory circuit 18 are input to the multiplexer 25. The multiplexer 25 has a function of selecting and outputting one of the two output signals in accordance with data stored in the memory circuit 26. An output signal from the multiplexer 25 is output from the output terminal 23.

Structural Example of Logic Array

Figure 5:
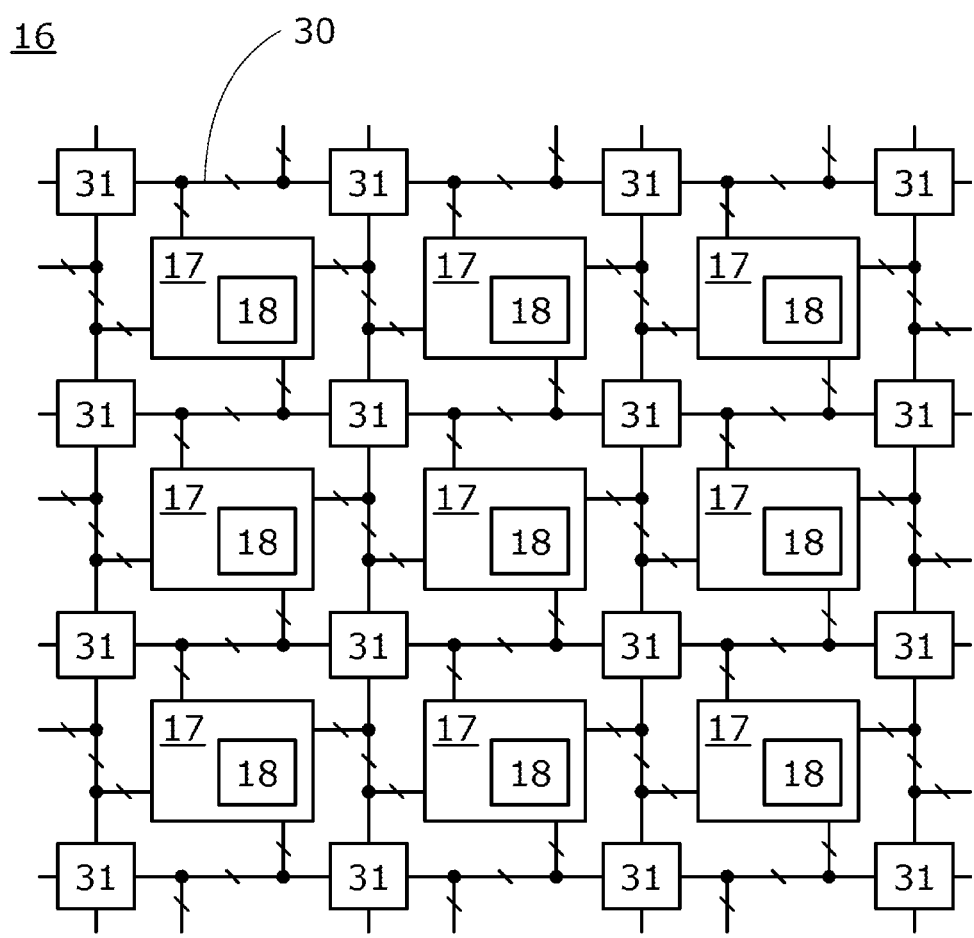
FIG. 5 illustrates a structure of a logic array.

FIG. 5 illustrates a structural example of the logic array 16. The logic array 16 includes a plurality of circuits 17, a plurality of wirings 30 electrically connected to input terminals or output terminals of the circuits 17, and switch circuits 31 with a function of controlling electrical continuity between the wirings 30. Electrical continuity between the circuits 17 is controlled by the wirings 30 and the switch circuits 31. Electrical continuity between the wirings 30, which is controlled by the switch circuits 31, is determined based on the second data stored in the memory circuit 19 illustrated in FIG. 1.

The logic array 16 illustrated in FIG. 5 may be provided with a wiring having a function of supplying the signal CLK or a signal RES to the circuits 17, in addition to the wirings 30 electrically connected to the input terminals or output terminals of the circuits 17. The signal CLK can be used to control timing of signal output from the memory circuit 18 in any of the circuits 17 illustrated in FIGS. 4A to 4C, for example. Moreover, the memory circuit 18 in any of the circuits 17 illustrated in FIGS. 4A to 4C may have a function of initializing stored data in accordance with the signal RES, for example.

Figure 6:
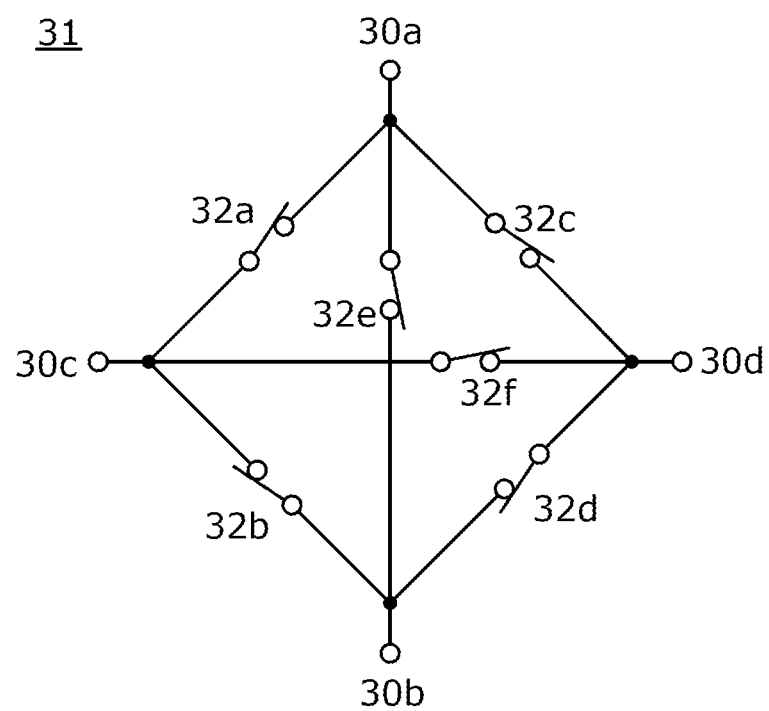
FIG. 6 illustrates a structure of a switch circuit.

FIG. 6 illustrates a structural example of the switch circuit 31 that controls electrical continuity between wirings 30a to 30d included in the wirings 30. Specifically, the switch circuit 31 in FIG. 6 includes switches 32a to 32f. Transistors can be used as the switches 32a to 32f.

Note that one transistor can be used as one of the switches 32a to 32f, or two or more transistors can be used as one of the switches 32a to 32f. When a plurality of transistors are used as one of the switches 32a to 32f, the transistors may be connected to each other in parallel, series, or series-parallel.

Note that in this specification, a state in which transistors are connected to each other in series means, for example, a state in which only one of a source and a drain of a first transistor is connected to only one of a source and a drain of a second transistor. In addition, a state in which transistors are connected to each other in parallel means a state in which one of a source and a drain of a first transistor is connected to one of a source and a drain of a second transistor and the other of the source and the drain of the first transistor is connected to the other of the source and the drain of the second transistor.

The on/off state (switching) of the switches 32a to 32f is determined by the second data stored in the memory circuit 19 illustrated in FIG. 1.

Specifically, the switch 32a has a function of controlling electrical continuity between the wiring 30a and the wiring 30c. The switch 32b has a function of controlling electrical continuity between the wiring 30b and the wiring 30c. The switch 32c has a function of controlling electrical continuity between the wiring 30a and the wiring 30d. The switch 32d has a function of controlling electrical continuity between the wiring 30b and the wiring 30d. The switch 32e has a function of controlling electrical continuity between the wiring 30a and the wiring 30b. The switch 32f has a function of controlling electrical continuity between the wiring 30c and the wiring 30d.

With the above structure, the switch circuit 31 in FIG. 6 can control electrical continuity between the wirings 30. Note that the switch circuit 31 may have a function of controlling electrical continuity between the wirings 30 and an output terminal (not shown) of the logic array 16.

Switch circuits such as the switch circuit 31 may have another function in addition to a function of controlling electrical continuity between circuits, elements, and terminals, for example, and thus may be referred to as a first circuit, a second circuit, and the like or simply circuits.

The integrated circuit 12 may include an I/O element, a phase locked loop (PLL), a RAM, and a multiplier in addition to the logic array 16 and the memory circuit 19 illustrated in FIG. 1. The I/O element functions as an interface that controls input/output of a signal from/to an external circuit of the integrated circuit 12. The PLL has a function of generating the signal CLK. The RAM has a function of storing data used for logical operation. The multiplier corresponds to a logic circuit for multiplication. The multiplier is not necessarily provided when the logic array 16 has a function of executing multiplication.

Specific Structural Example of Semiconductor Device

Figure 7:
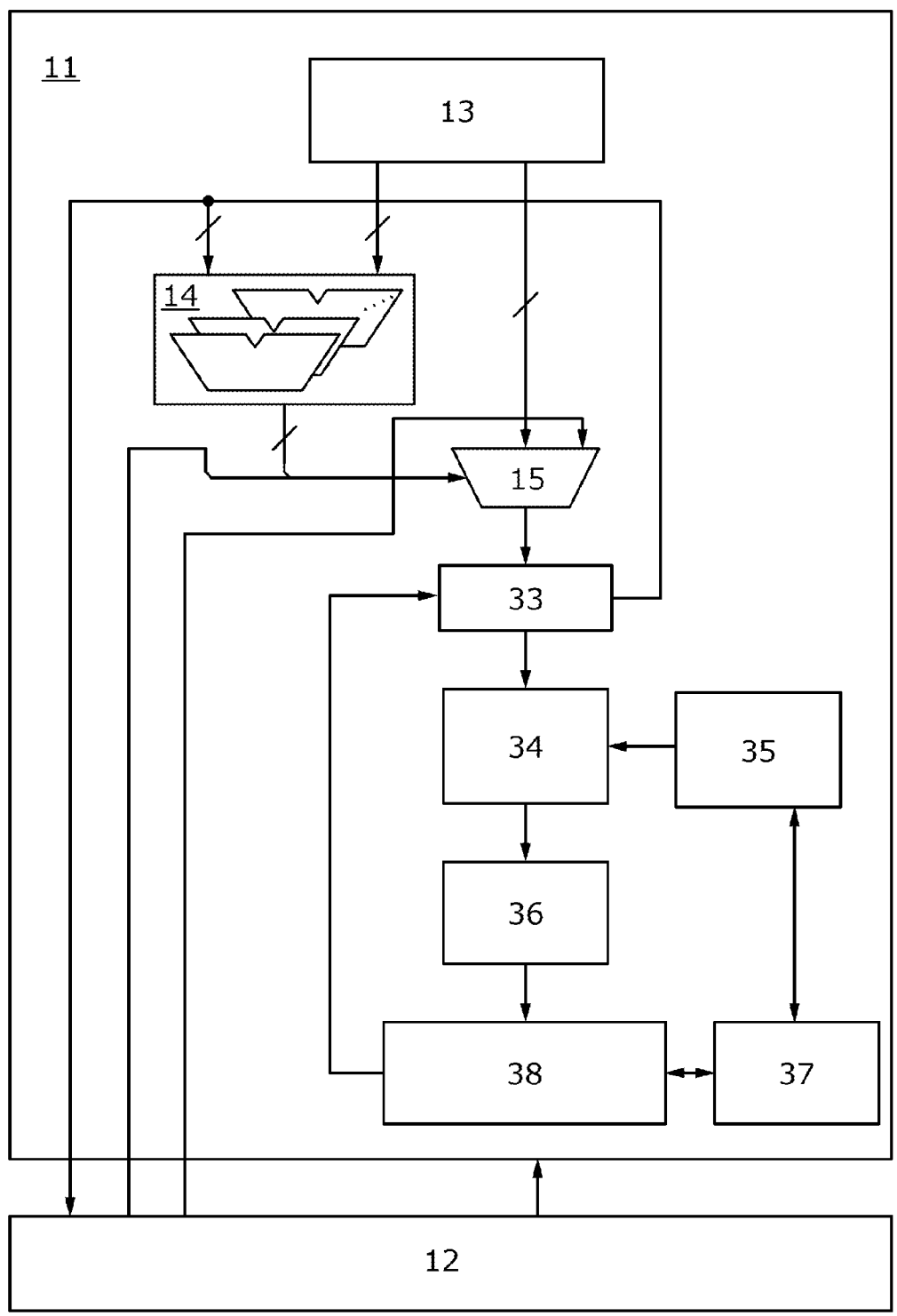
FIG. 7 illustrates a structure of a semiconductor device.

FIG. 7 is a block diagram illustrating a more specific example of the structure of the semiconductor device 10 illustrated in FIG. 1. Although the block diagram attached to this specification shows components classified by their functions in independent blocks, it is difficult to classify actual components according to their functions completely, and one component can have a plurality of functions.

Like the semiconductor device 10 illustrated in FIG. 1, the semiconductor device 10 illustrated in FIG. 7 includes the integrated circuit 11 and the integrated circuit 12. As in the semiconductor device 10 in FIG. 1, the integrated circuit 11 in FIG. 7 includes the memory circuit 13, at least one comparator circuit 14, and the selector circuit 15. Furthermore, the semiconductor device 10 in FIG. 7 includes a circuit 33, an instruction cache 34, a main memory 35, an instruction register 36, a data cache 37, and an execution unit 38.

The execution unit 38 has a function of generating a variety of control signals by decoding an instruction input from the instruction register 36 and a function of performing various arithmetic operations such as four arithmetic operations and logical operation in accordance with the control signals. The data cache 37 functions as a buffer memory for temporarily storing frequently used data, such as data read from the main memory 35, data obtained during the arithmetic operation of the execution unit 38, or data obtained as a result of the arithmetic operation of the execution unit 38. The instruction cache 34 functions as a buffer memory for temporarily storing a frequently used instruction among instructions sent to the execution unit 38 via the instruction register 36. The circuit 33 has a function of storing an address of an instruction to be executed next. The main memory 35 has a function of storing data used for the arithmetic operation in the execution unit 38 and an instruction to be executed in the execution unit 38.

When the first data including a prediction of whether a branch condition of a branch instruction is satisfied or not is input to the circuit 33, an address of an instruction to be executed next is determined in the circuit 33 in accordance with the first data. The execution unit 38 reads an instruction from an address in the instruction cache 34 corresponding to the address of the instruction to be executed next, which is stored in the circuit 33, and makes the instruction register 36 store the instruction. When the instruction is not stored in the corresponding address of the instruction cache 34, the execution unit 38 accesses a corresponding address of the main memory 35, reads the instruction from the main memory 35, and makes the instruction register 36 store the instruction. In this case, the instruction is also stored in the instruction cache 34.

The execution unit 38 decodes the instruction stored in the instruction register 36 and executes processing corresponding to the instruction. When the instruction to be executed is an arithmetic instruction, an arithmetic logic unit (ALU) included in the execution unit 38 performs an arithmetic operation by using data stored in an internal register or data stored in the data cache 37, and the result of the arithmetic operation is stored in the internal register or the data cache 37.

Then, when instruction execution is completed, the execution unit 38 accesses the circuit 33 again and repeats the above procedure of decoding and executing an instruction read from the instruction register 36 via the instruction cache 34.

Figure 8:
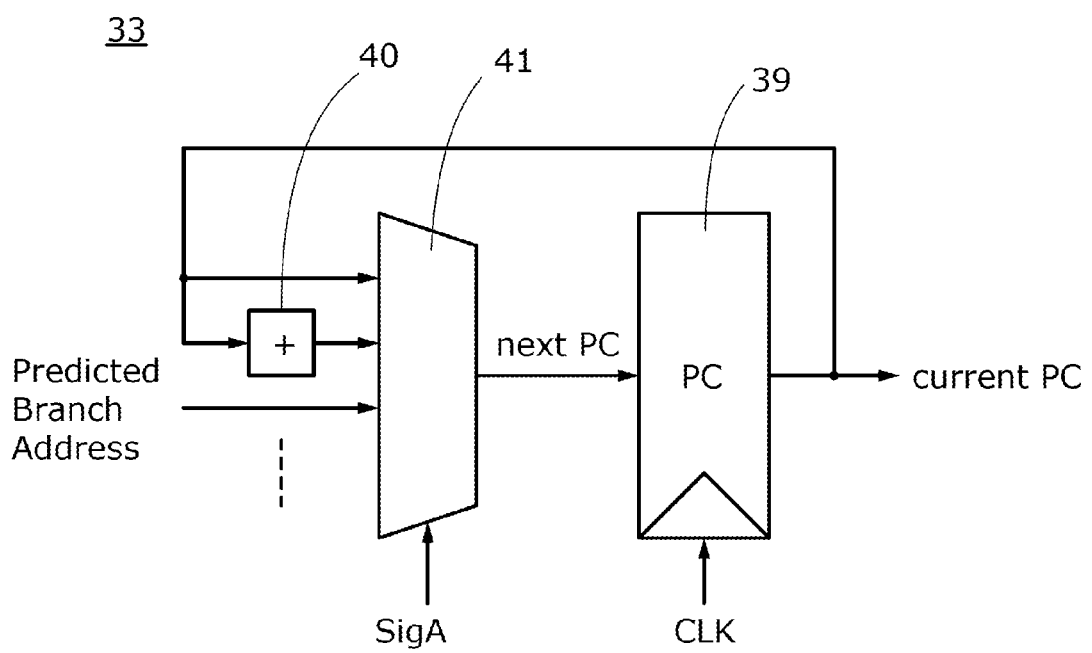
FIG. 8 illustrates a structure of a circuit 33.

FIG. 8 illustrates an example of the structure of the circuit 33. The circuit 33 includes a program counter 39, an adder circuit 40, and a selector circuit 41.

The circuit 33 has a function of generating a second address (current PC) of an instruction to be executed next in the execution unit 38. The program counter 39 has a function of storing the second address (current PC). The adder circuit 40 has a function of generating an address by adding a given increment, for example, "1" to the second address (current PC).

The selector circuit 41 has a function of selecting one of the second address (current PC) output from the program counter 39, the address generated in the adder circuit 40, and the first address (predicted branch address) corresponding to a branch instruction, in accordance with a signal SigA as a second address (next PC) of an instruction to be executed next in the execution unit 38.

For example, when instructions are executed in the order of address, the address generated in the adder circuit 40 is selected by the selector circuit 41 and input to the program counter 39 as the second address (current PC). When the pipeline is stopped because an instruction cannot be executed until the arithmetic result of the previous instruction is obtained, for example, or when an instruction corresponding to an address generated in the adder circuit 40 cannot be carried out due to a cache miss or the like, the second address (current PC) is selected by the selector circuit 41 and input to the program counter 39 as the second address (current PC). When branch prediction is made that a branch condition will be satisfied, the first address (predicted branch address) corresponding to an address of a branch target instruction predicted to be executed after the branch instruction is selected by the selector circuit 41 and input to the program counter 39 as the second address (current PC). The first data including a history of whether a branch condition of a branch instruction is satisfied or not is reflected in the signal SigA. When branch prediction is made that a branch condition will not be satisfied, it is possible to select an address obtained by adding a given increment to the second address (current PC).

The second address (next PC) that is selected by the selector circuit 41 and output is fetched in the program counter 39 in accordance of the edge of the signal CLK, and is output from the circuit 33 as the second address (current PC).

At the time of executing a branch instruction, when the execution unit 38 judges that the pair BR of the first address and the first data corresponding to the branch instruction is not stored in the memory circuit 13, it can add the pair BR corresponding to the branch instruction to the memory circuit 13.

When the first address corresponding to the second address (current PC) is not stored in the memory circuit 13, the execution unit 38 generates the signal SigA from a signal that is output from the selector circuit 15 and includes information about mismatch, and supplies the signal SigA to the circuit 33. Moreover, the first address (predicted branch address) becomes invalid. The signal SigA is generated so that the selector circuit 41 that receives the signal including information about mismatch does not select the first address (predicted branch address) corresponding to the branch instruction as the second address (next PC).

Structural Example of Integrated Circuit 12

Next, the description is made on a specific structural example of the integrated circuit 12 in which the memory circuit 19 has a function of controlling electrical continuity between the circuits 17 in accordance with the second data including information on a circuit composed of the circuits 17, in addition to a function of storing the second data.

Figure 9:
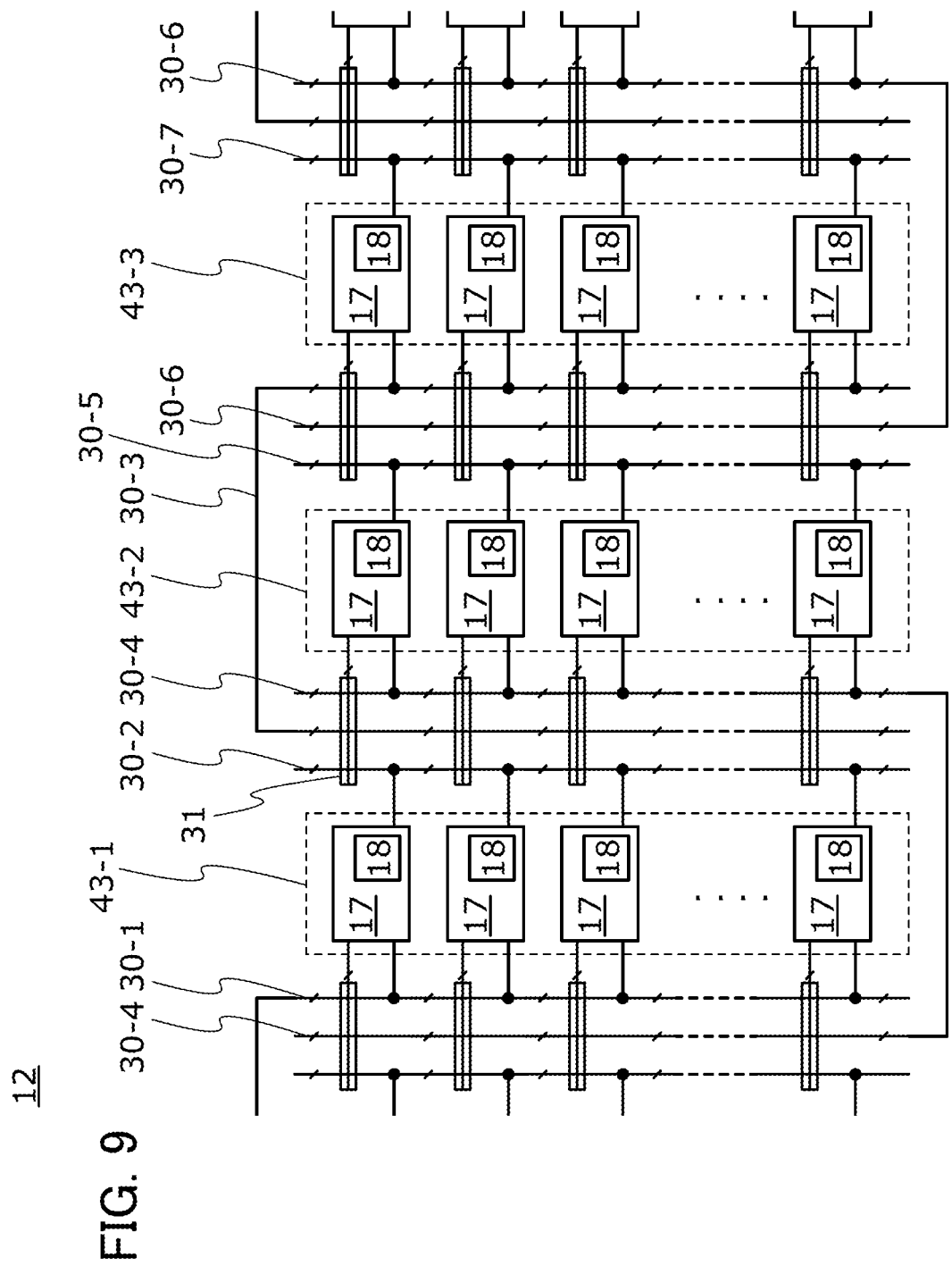
FIG. 9 illustrates a structural example of an integrated circuit.

FIG. 9 illustrates an example of part of the structure of the integrated circuit 12. FIG. 9 shows a first column 43-1 including circuits 17, a second column 43-2 including circuits 17, and a third column 43-3 including circuits 17. FIG. 9 illustrates an example where the first column 43-1, the second column 43-2, and the third column 43-3 are positioned in parallel in this order from the left.

In FIG. 9, the integrated circuit 12 includes a plurality of wirings 30 shown as wirings 30-1 to 30-7.

A first output terminal of each circuit 17 in the first column 43-1 is electrically connected to one of the wirings 30-1. A second output terminal of each circuit 17 in the first column 43-1 is electrically connected to one of the wirings 30-2. A first output terminal of each circuit 17 in the second column 43-2 is electrically connected to one of the wirings 30-4. A second output terminal of each circuit 17 in the second column 43-2 is electrically connected to one of the wirings 30-5. A first output terminal of each circuit 17 in the third column 43-3 is electrically connected to one of the wirings 30-3. A second output terminal of each circuit 17 in the third column 43-3 is electrically connected to one of the wirings 30-7.

Note that the number of the first output terminals and the number of the second output terminals of each circuit 17 are not limited to one, and either or both of the number of the first output terminals and the number of the second output terminals may be more than one. Note also that one output terminal is always connected to one wiring regardless of the number of the first output terminals and the number of the second output terminals. Thus, when one column includes Y circuits 17 (Y is a natural number), the integrated circuit 12 at least includes Y wirings connected to the first output terminals and Y wirings connected to the second output terminals.

The first column 43-1 is placed between the wirings 30-1 and the wirings 30-2. The second column 43-2 is placed between the wirings 30-4 and the wirings 30-5. The third column 43-3 is placed between the wirings 30-3 and the wirings 30-7.

The wirings 30-4, which are connected to the first output terminals of the circuits 17 in the second column 43-2, are provided both between the first column 43-1 and the second column 43-2 and between the first column 43-1 and a column (not illustrated) of the circuits 17 positioned on the left side of the first column 43-1 in FIG. 9. The wirings 30-3, which are connected to the first output terminals of the circuits 17 in the third column 43-3, are provided both between the first column 43-1 and the second column 43-2 and between the second column 43-2 and the third column 43-3. The wirings 30-6, which are connected to the first output terminals of the circuits 17 (not illustrated) positioned on the right side of the third column 43-3 in FIG. 9, are provided both between the second column 43-2 and the third column 43-3 and between the third column 43-3 and a column (not illustrated) of the circuits 17 positioned on the right side of the third column 43-3.

When attention is focused on an N-th column (N is a natural number of 3 or more), a plurality of wirings connected to the first output terminals of the circuits 17 in the N-th column are provided both between the N-th column and an (N−1)th column and between the (N−1)th column and an (N−2)th column. In the case where N is 2, a plurality of wirings electrically connected to the first output terminals of the circuits 17 in the second column are provided both between the second column and the first column and between the first column and an I/O element.

In one embodiment of the present invention, when attention is focused on the (N−1)th column (N is a natural number of 3 or more), wirings 30 electrically connected to the first output terminals of the circuits 17 in the (N−1)th column, wirings 30 electrically connected to the first output terminals of the circuits 17 in the N-th column, and wirings 30 electrically connected to the second output terminals of the circuits 17 in the (N−2)th column are electrically connected to the input terminals of the circuits 17 in the (N−1)th column through switch circuits 31.

Specifically, in FIG. 9, for example, the wirings 30-4 electrically connected to the first output terminals of the circuits 17 in the second column 43-2, the wirings 30-3 electrically connected to the first output terminals of the circuits 17 in the third column 43-3, and the wirings 30-2 electrically connected to the second output terminals of the circuits 17 in the first column 43-1 are electrically connected to the input terminals of the circuits 17 in the second column 43-2 through the switch circuits 31.

Figure 10A:
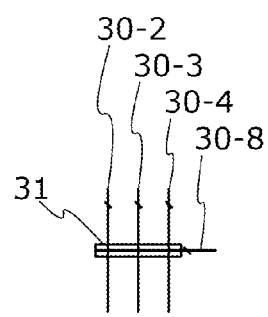
FIGS. 10A to 10C illustrate a structure of a switch circuit.

FIG. 10A is a circuit diagram of the switch circuit 31 that controls electrical continuity between the wirings 30-2, 30-3, and 30-4 and the input terminals of the circuits 17 in the second column 43-2 illustrated in FIG. 9. In FIG. 10A, a plurality of wirings 30-8 included in the wirings 30 are electrically connected to a plurality of input terminals of the circuit 17 in the second column 43-2.

Figure 10B:
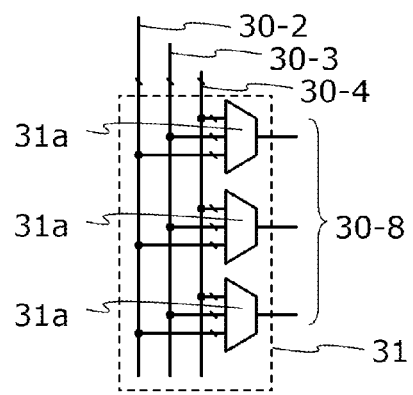

FIG. 10B illustrates a specific structural example of the switch circuit 31 illustrated in FIG. 10A. The switch circuit 31 in FIG. 10A includes three switch circuits 31a as illustrated in FIG. 10B.

FIG. 10B illustrates the switch circuit 31 corresponding to three wirings 30-8 and thus shows the case where the switch circuit 31 includes the three switch circuits 31a. The number of the switch circuits 31a included in the switch circuit 31 can be determined in accordance with the number of the input terminals of the circuit 17.

As a typical example, FIGS. 10A and 10B illustrate the switch circuit 31 that controls electrical continuity between the wirings 30-2, 30-3, and 30-4 and the wirings 30-8; other switch circuits 31 that control electrical continuity between a group of wirings 30 and another group of wirings 30 in FIG. 9 have a structure similar to the above.

Figure 10C:
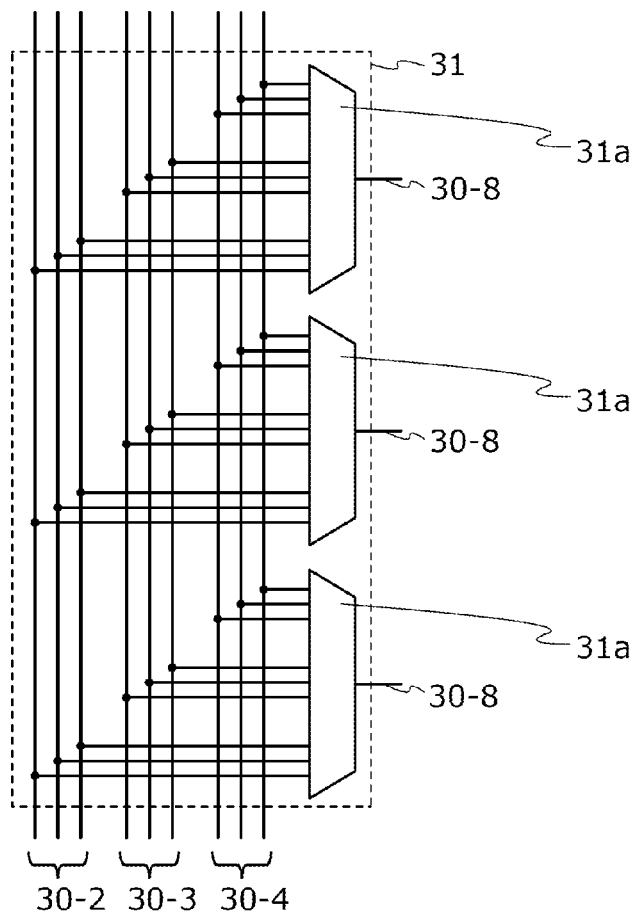

FIG. 10C illustrates a more specific structural example of the switch circuit 31 in FIG. 10B. FIG. 10C more specifically shows a connection relation between the wirings 30-2, 30-3, and 30-4 and the switch circuit 31. As illustrated in FIG. 10C, each of the switch circuits 31a controls electrical continuity between all the wirings 30-2, 30-3, and 30-4 and one of the wirings 30-8.

The switch circuit 31a illustrated in FIGS. 10B and 10C functions as the memory circuit 19 illustrated in FIG. 1. That is, the switch circuit 31a has a function of storing the second data including circuit information as well as a function of controlling electrical continuity between the circuits 17 in accordance with the second data.

Next, a specific structural example of the switch circuit 31a will be described with reference to FIG. 11. The switch circuit 31a illustrated in FIG. 11 includes a plurality of wirings BL shown as wirings BL-1 to BL-x (x is a natural number of 2 or more), a plurality of wirings OL shown as wirings OL-1 to OL-x, the wiring 30-8, a plurality of wirings WL shown as wirings WL-1 to WL-y (y is a natural number of 2 or more), and a plurality of wirings CL shown as wirings CL-1 to CL-y.

Figure 11:
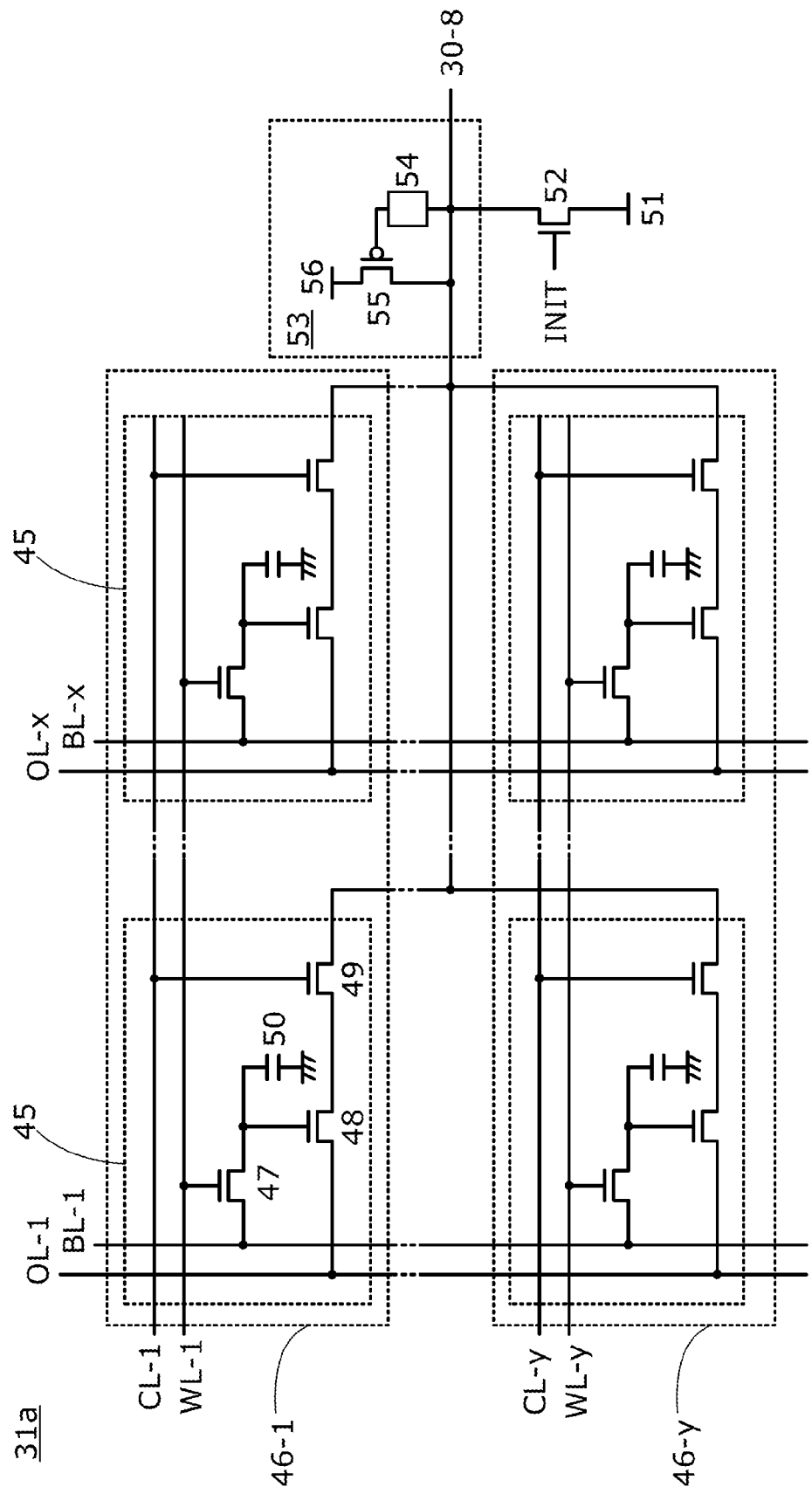
FIG. 11 illustrates a structure of a switch circuit.

When the switch circuit 31a in FIG. 11 is used in FIG. 10C, the wirings 30-2, 30-3, and 30-4 in FIG. 10C correspond to the wirings OL-1 to OL-x in FIG. 11.

The switch circuit 31a in FIG. 11 also includes x×y circuits 45. Each of the circuits 45 at least includes a transistor 47, a transistor 48, a transistor 49, and a capacitor 50. The x×y circuits 45 form y sets 46 each of which is composed of x circuits 45 connected to the wiring WL-j and the wiring CL-j (j is a natural number of y or less). In FIG. 11, they sets 46 are shown as sets 46-1 to 46-y.

Specifically, in the circuit 45 in the j-th row and the i-th column (i is a natural number of x or less), a gate of the transistor 47 is electrically connected to the wiring WL-j. One of a source and a drain of the transistor 47 is electrically connected to the wiring BL-i, and the other thereof is electrically connected to a gate of the transistor 48. One of a source and a drain of the transistor 48 is electrically connected to the wiring OL-i, and the other thereof is electrically connected to one of a source and a drain of the transistor 49. The other of the source and the drain of the transistor 49 is electrically connected to the wiring 30-8. A gate of the transistor 49 is electrically connected to the wiring CL-j. The capacitor 50 is connected to the gate of the transistor 48.

The circuit 45 may further include another circuit element such as a transistor, a diode, a resistor, a capacitor, or an inductor as needed.

In the switch circuit 31a in FIG. 11, when a potential of a signal including the second data is applied to the wiring BL while the transistor 47 is on, the potential is supplied to the gate of the transistor 48 through the transistor 47. Then, when the transistor 47 is turned off, the potential supplied to the gate of the transistor 48 is maintained. The on/off state of the transistor 48 is selected depending on the gate potential that reflects the second data.

Since the transistor 49 is electrically connected in series to the transistor 48, the transistors 48 and 49 collectively have a function of controlling electrical continuity between the wiring OL and the wiring 30-8. Specifically, when the transistors 48 and 49 are on, electrical continuity is established between the wiring OL and the wiring 30-8. When at least one of the transistors 48 and 49 is off, the wiring OL and the wiring 30-8 are electrically isolated from each other. That is, electrical continuity between the wirings OL and the wiring 30-8 is determined in accordance with the potential of a signal including the second data held in the circuits 45.

One of the circuits 17 illustrated in FIG. 9 is connected to the wiring OL, and one of the circuits 17 is connected to the wiring 30-8. Accordingly, electrical continuity between the circuits 17 is controlled in accordance with the second data written to the circuits 45 in the switch circuit 31a.

The switch circuit 31a illustrated in FIG. 11 includes a switch 52 for controlling electrical continuity between the wiring 30-8 and a wiring 51 supplied with a predetermined potential. In FIG. 11, one transistor is used as the switch 52. The switch 52 is turned on and off in accordance with the signal NIT. Specifically, the potential of the wiring 51 is applied to the wiring 30-8 when the switch 52 is on, whereas the potential of the wiring 51 is not applied to the wiring 30-8 when the switch 52 is off.

By turning on the switch 52, the potential of the wiring 30-8 can be initialized to a predetermined level. Initialization of the potential of the wiring 30-8 prevents a large amount of current from flowing between the wiring 30-8 and the wirings OL even when the potentials of the wiring 30-8 and the wirings OL are indefinite while the second data is retained. Thus, breakage of the integrated circuit 12 can be prevented.

In the period during which the second data is maintained, the potential of the wiring 30-8 sometimes becomes intermediate between high-level and low-level potentials. When the intermediate potential is applied to the input terminal of the circuit 17, a shoot-through current is likely to be generated in the circuit 17 connected to the wiring 30-8. However, since the potential of the wiring 30-8 can be initialized as described above, the input terminal can be prevented from having the intermediate potential immediately after power is turned on; thus, generation of the shoot-through current can be prevented.

A latch may be electrically connected to the wiring 30-8. In FIG. 11, a latch 53 as well as the switch 52 for initialization is electrically connected to the wiring 30-8. The latch 53 has a function of keeping the potential of the wiring 30-8 high or low. Electrically connecting the latch 53 to the wiring 30-8 enables the potential of the wiring 30-8 to be kept high or low, thereby preventing a shoot-through current from being generated in the circuit 17 whose input terminal is connected to the wiring 30-8 by application of the intermediate potential to the wiring 30-8.

Specifically, the latch 53 in FIG. 11 includes a circuit 54 having a function of inverting the polarity of a potential and a transistor 55. As the circuit 54, an inverter can be used, for example. An input terminal of the circuit 54 is electrically connected to the wiring 30-8. An output terminal of the circuit 54 is electrically connected to a gate of the transistor 55. One of a source and a drain of the transistor 55 is electrically connected to a wiring 56 supplied with a potential higher than a potential applied to the wiring 51. The other of the source and the drain of the transistor 55 is electrically connected to the wiring 30-8.

Note that the transistor 47 in the switch circuit 31a of FIG. 11 is preferably a transistor with ultralow off-state current because it has a function of holding the gate potential of the transistor 48. A transistor in which a channel formation region is formed in a film of a semiconductor with a wider band gap and lower intrinsic carrier density than silicon can have extremely low off-state current and thus is preferably used as the transistor 47. Examples of such a semiconductor are an oxide semiconductor and gallium nitride each having a band gap more than twice as wide as that of silicon. A transistor including the above semiconductor can have much lower off-state current than a transistor including a normal semiconductor such as silicon or germanium. Thus, the use of the transistor 47 having the above structure can prevent leakage of electric charge held at the gate of the transistor 48.

In the circuit 45 of the switch circuit 31a in FIG. 11, the gate of the transistor 48 is floating and highly insulated from other electrodes and wirings when the transistor 47 is off, so that a boosting effect described below is obtained. Specifically, when the gate of the transistor 48 is floating in the circuit 45, as the potential of the wiring OL changes from low level to high level, the gate potential of the transistor 48 is increased by a capacitance Cgs generated between the source and the gate of the transistor 48 serving as a switch. The amount of increase in the gate potential of the transistor 48 depends on the logical level of a potential input to the gate of the transistor 48. Specifically, when the potential of the second data written to the circuit 45 is a logical level "0", the transistor 48 is in a weak inversion mode, so that the capacitance Cgs that contributes to an increase in the gate potential of the transistor 48 includes a capacitance Cos that is independent of the gate potential of the transistor 48. More specifically, the capacitance Cos includes an overlap capacitance generated in a region where the gate electrode and the source region overlap with each other, and a parasitic capacitance generated between the gate electrode and the source electrode, for example. On the other hand, when the potential of the second data written to the circuit 45 is a logical level "1", the transistor 48 is in a strong inversion mode, so that the capacitance Cgs includes part of a capacitance Cox generated between a channel formation region and the gate electrode, in addition to the capacitance Cos. Thus, when the potential of the second data is the logical level "1", the capacitance Cgs is larger than that when the potential is the logical level "0". Consequently, in the circuit 45, a boosting effect with which the gate potential of the transistor 48 is further increased with a change in the potential of the wiring OL is more enhanced when the potential of the second data is the logical level "1" than when the potential is the logical level "0". Thus, when the potential of the second data written to the circuit 45 is the logical level "1", the transistor 48 serving as a switch can be turned on and the switching speed of the circuit 45 can be increased because the gate potential of the transistor 48 can be increased by the boosting effect even if the gate potential of the transistor 48 is lower than the potential of a signal including the second data input to the wiring BL by the threshold voltage of the transistor 47. When the potential of the second data is the logical level "0", the transistor 48 serving as a switch can remain off.

[Transistors]

Next, the description is made on a structural example of a transistor 80 having a channel formation region in an oxide semiconductor film.

Figure 12A:
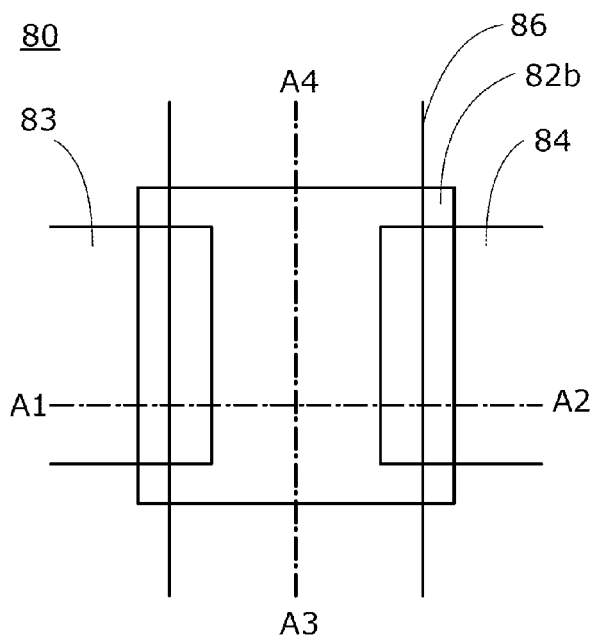
FIGS. 12A to 12C illustrate a structure of a transistor.
Figure 12C:
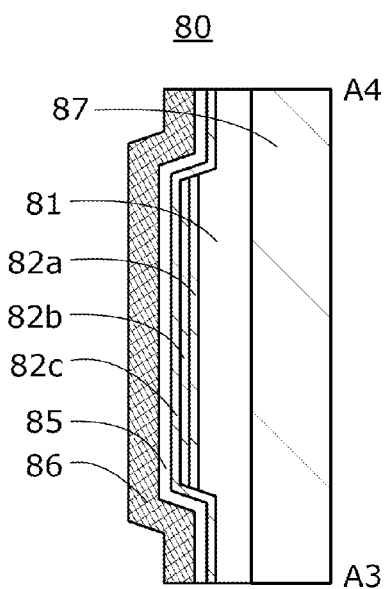
Figure 12B:
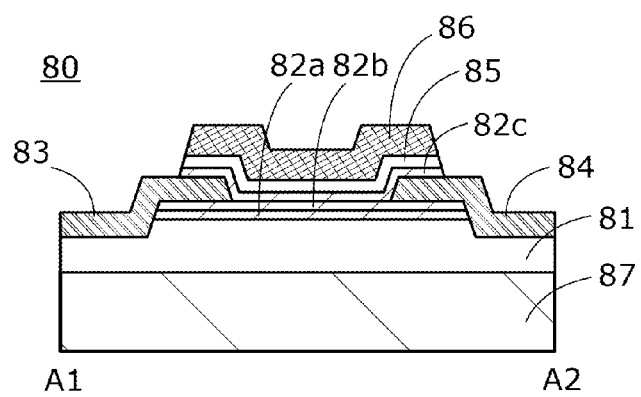

FIGS. 12A to 12C illustrate an example of the structure of the transistor 80 that includes the channel formation region in the oxide semiconductor film. FIG. 12A is a top view of the transistor 80. Note that various insulating films are not illustrated in FIG. 12A in order to clarify the layout of the transistor 80. FIG. 12B is a cross-sectional view along the dashed line A1-A2 in the top view in FIG. 12A. FIG. 12C is a cross-sectional view along the dashed line A3-A4 in the top view in FIG. 12A.

As illustrated in FIGS. 12A to 12C, the transistor 80 includes an oxide semiconductor film 82a and an oxide semiconductor film 82b that are stacked in this order over an insulating film 81 formed over a substrate 87; a conductive film 83 and a conductive film 84 that are electrically connected to the oxide semiconductor film 82b and function as a source electrode and a drain electrode; an oxide semiconductor film 82c over the oxide semiconductor film 82b, the conductive film 83, and the conductive film 84; an insulating film 85 that functions as a gate insulating film and is located over the oxide semiconductor film 82c; and a conductive film 86 that functions as a gate electrode and overlaps the oxide semiconductor films 82a to 82c with the insulating film 85 placed therebetween. The substrate 87 may be a glass substrate, a semiconductor substrate, or an element substrate that is a glass substrate or a semiconductor substrate over which a semiconductor element is formed.

Figure 13A:
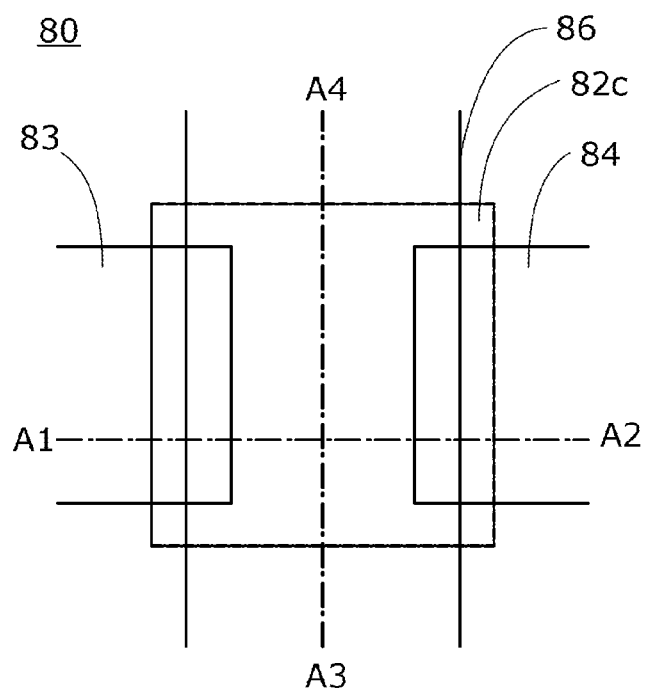
FIGS. 13A to 13C illustrate a structure of a transistor.
Figure 13C:
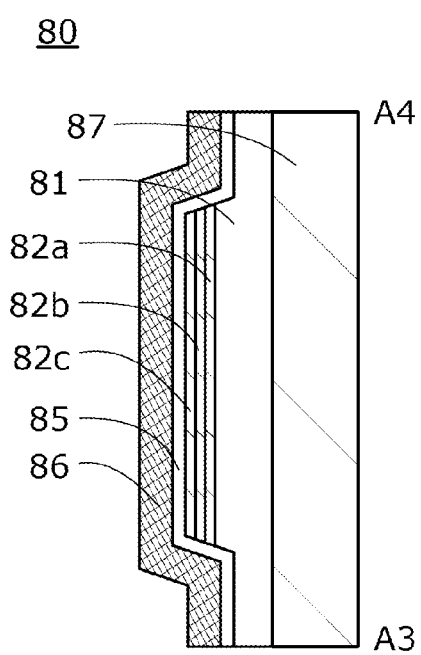
Figure 13B:
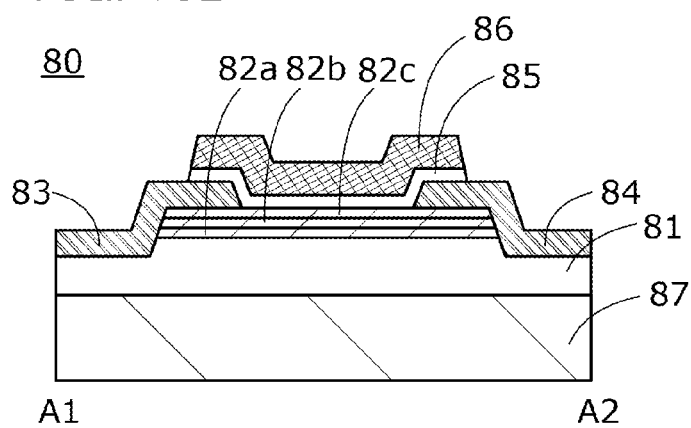

FIGS. 13A to 13C illustrate another specific example of the structure of the transistor 80. FIG. 13A is a top view of the transistor 80. Note that various insulating films are not illustrated in FIG. 13A in order to clarify the layout of the transistor 80. FIG. 13B is a cross-sectional view along the dashed line A1-A2 in the top view in FIG. 13A. FIG. 13C is a cross-sectional view along the dashed line A3-A4 in the top view in FIG. 13A.

As illustrated in FIGS. 13A to 13C, the transistor 80 includes the oxide semiconductor films 82a to 82c that are stacked in this order over the insulating film 81; the conductive films 83 and 84 that are electrically connected to the oxide semiconductor film 82c and function as a source electrode and a drain electrode; the insulating film 85 that functions as a gate insulating film and is located over the oxide semiconductor film 82c, the conductive film 83, and the conductive film 84; and the conductive film 86 that functions as a gate electrode and overlaps the oxide semiconductor films 82a to 82c with the insulating film 85 placed therebetween.

FIGS. 12A to 12C and FIGS. 13A to 13C illustrate the structure examples of the transistor 80 in which the oxide semiconductor films 82a to 82c are stacked. The oxide semiconductor film of the transistor 80 is not limited to a stack including a plurality of oxide semiconductor films and may be a single oxide semiconductor film.

When the transistor 80 includes the semiconductor film including the oxide semiconductor films 82a to 82c stacked in this order, each of the oxide semiconductor films 82a and 82c is an oxide film that contains at least one of metal elements contained in the oxide semiconductor film 82b and whose lowest conduction band energy is closer to the vacuum level than that of the oxide semiconductor film 82b by higher than or equal to 0.05 eV, 0.07 eV, 0.1 eV, or 0.15 eV and lower than or equal to 2 eV, 1 eV, 0.5 eV, or 0.4 eV. The oxide semiconductor film 82b preferably contains at least indium because carrier mobility is increased.

When the transistor 80 includes the semiconductor film with the above structure, when an electric field is applied to the semiconductor film by applying voltage to the gate electrode, a channel region is formed in the oxide semiconductor film 82b, which has the lowest conduction band energy among the oxide semiconductor films. That is, the oxide semiconductor film 82c provided between the oxide semiconductor film 82b and the insulating film 85 makes it possible to form the channel region in the oxide semiconductor film 82b, which is separated from the insulating film 85.

Since the oxide semiconductor film 82c contains at least one of the metal elements contained in the oxide semiconductor film 82b, interface scattering is less likely to occur at the interface between the oxide semiconductor film 82b and the oxide semiconductor film 82c. Thus, carriers are not easily inhibited from moving at the interface, resulting in an increase in the field-effect mobility of the transistor 80.

If an interface level is formed at the interface between the oxide semiconductor film 82a and the oxide semiconductor film 82b, a channel region is formed also in the vicinity of the interface; thus, the threshold voltage of the transistor 80 varies. However, since the oxide semiconductor film 82a contains at least one of the metal elements contained in the oxide semiconductor film 82b, an interface level is less likely to be formed at the interface between the oxide semiconductor film 82a and the oxide semiconductor film 82b. Accordingly, the above structure can reduce variations in the electrical characteristics of the transistors 80, such as the threshold voltage.

A plurality of oxide semiconductor films are preferably stacked so that an interface level that inhibits carrier flow is not formed at the interface between the oxide semiconductor films due to an impurity existing between the oxide semiconductor films. This is because if an impurity exists between the stacked oxide semiconductor films, the continuity of the lowest conduction band energy between the oxide semiconductor films is lost, and carriers are trapped or disappear by recombination in the vicinity of the interface. By reducing an impurity existing between the films, a continuous junction (here, particularly a U-shape well structure whose lowest conduction band energy is changed continuously between the films) is formed more easily than the case of merely stacking a plurality of oxide semiconductor films that contain at least one common metal as a main component.

In order to form such a continuous energy band, the films need to be stacked successively without being exposed to the air by using a multi-chamber deposition system (sputtering system) provided with a load lock chamber. Each chamber of the sputtering apparatus is preferably evacuated to a high vacuum (to about $5 \times 10^{-7}$ Pa to $1 \times 10^{-4}$ Pa) by an adsorption vacuum pump such as a cryopump so that water and the like acting as impurities for the oxide semiconductor are removed as much as possible. Alternatively, a turbo molecular pump and a cold trap are preferably used in combination to prevent backflow of gas into the chamber through an evacuation system.

To obtain a highly purified intrinsic oxide semiconductor, not only high vacuum evacuation of the chambers but also high purification of a gas used in the sputtering is important. When an oxygen gas or an argon gas used as the sputtering gas is highly purified to have a dew point of −40° C. or lower, preferably −80° C. or lower, more preferably −100° C. or lower, moisture and the like can be prevented from entering the oxide semiconductor film as much as possible. Specifically, when the oxide semiconductor film 82b is an In-M-Zn oxide film (M is Ga, Y, Zr, La, Ce, or Nd) and a target having the atomic ratio of metal elements of In:M:Zn=$x_1$:$y_1$:$z_1$ is used to form the oxide semiconductor film 82b, $x_1/y_1$ ranges preferably from 1/3 to 6, more preferably from 1 to 6 and $z_1/y_1$ ranges preferably from 1/3 to 6, more preferably from 1 to 6. Note that $z_1/y_1$ in the range of 1 to 6 facilitates formation of a c-axis aligned crystalline oxide semiconductor (CAAC-OS) film as the oxide semiconductor film 82b. Typical examples of the atomic ratio of the metal elements of the target are In:M:Zn=1:1:1 and In:M:Zn=3:1:2.

Specifically, when the oxide semiconductor films 82a and 82c contain an In-M-Zn oxide (M is Ga, Y, Zr, La, Ce, or Nd) and the atomic ratio of metal elements of In to M and Zn in a target for forming the oxide semiconductor films 82a and 82c is $x_2$:$y_2$:z, it is preferable that $x_2/y_2$ be less than $x_1/y_1$ and that $z_2/y_2$ range from to 1/3 to 6, more preferably from 1 and to 6. Note that $z_2/y_2$ in the range of 1 to 6 facilitates formation of a CAAC-OS film as the oxide semiconductor films 82a and 82c. Typical examples of the atomic ratio of the metal elements of the target are In:M:Zn=1:3:2, In:M:Zn=1:3:4, In:M:Zn=1:3:6, and In:M:Zn=1:3:8.

The oxide semiconductor films 82a and 82c each have a thickness of 3 nm to 100 nm, preferably 3 nm to 50 nm. The oxide semiconductor film 82b has a thickness of 3 nm to 200 nm, preferably 3 nm to 100 nm, more preferably 3 nm to 50 nm.

In the three-layer semiconductor film, each of the oxide semiconductor films 82a to 82c can be amorphous or crystalline. Note that the oxide semiconductor film 82b in which a channel region is formed is preferably crystalline, in which case the transistor 80 can have stable electrical characteristics.

Note that a channel formation region refers to a region of a semiconductor film of a transistor that overlaps with a gate electrode and is located between a source electrode and a drain electrode. A channel region refers to a region through which current mainly flows in the channel formation region.

For example, when an In—Ga—Zn oxide film formed by sputtering is used as each of the oxide semiconductor films 82a and 82c, the oxide semiconductor films 82a and 82c can be deposited with the use of an In—Ga—Zn oxide target containing In, Ga, and Zn at an atomic ratio of 1:3:2. The deposition conditions can be as follows, for example: an argon gas (flow rate: 30 sccm) and an oxygen gas (flow rate: 15 sccm) are used as the deposition gas; the pressure is 0.4 Pa; the substrate temperature is 200° C.; and the DC power is 0.5 kW.

When the oxide semiconductor film 82b is a CAAC-OS film, the oxide semiconductor film 82b is preferably deposited with the use of a polycrystalline In—Ga—Zn oxide target containing In, Ga, and Zn at an atomic ratio of 1:1:1. The deposition conditions can be as follows, for example: an argon gas (flow rate: 30 sccm) and an oxygen gas (flow rate: 15 sccm) are used as the deposition gas; the pressure is 0.4 Pa; the substrate temperature is 300° C.; and the DC power is 0.5 kW.

Although the oxide semiconductor films 82a to 82c can be formed by sputtering, they may be formed by another method, e.g., a thermal CVD method. Examples of a thermal CVD method include metal organic chemical vapor deposition (MOCVD) and atomic layer deposition (ALD).

A highly purified oxide semiconductor (purified oxide semiconductor) obtained by reduction of impurities such as moisture or hydrogen serving as electron donors (donors) and reduction of oxygen vacancies has few carrier sources and thus can be an i-type (intrinsic) semiconductor or a substantially i-type semiconductor. For this reason, a transistor having a channel formation region in a highly purified oxide semiconductor film exhibits extremely low off-state current and has high reliability. A transistor including a channel formation region in the oxide semiconductor film is likely to have positive threshold voltage (also referred to as normally-off characteristics).

Specifically, various experiments can prove a low off-state current of a transistor having a channel formation region in a highly purified oxide semiconductor film. For example, the off-state current of even an element having a channel width of $1\times10^6$ μm and a channel length of 10 μm can be less than or equal to the measurement limit of a semiconductor parameter analyzer, that is, less than or equal to $1\times10^{-13}$ at a voltage between source and drain electrodes (drain voltage) of 1 V to 10 V. In this case, it can be seen that off-state current standardized on the channel width of the transistor is lower than or equal to 100 zA/μm. In addition, the off-state current is measured using a circuit in which a capacitor and a transistor are connected to each other and electric charge flowing into or from the capacitor is controlled by the transistor. In the measurement, a highly purified oxide semiconductor film is used for a channel formation region of the transistor, and the off-state current of the transistor is measured from a change in the amount of electric charge of the capacitor per unit time. As a result, it is found that when the voltage between the source and drain electrodes of the transistor is 3 V, a lower off-state current of several tens of yoctoamperes per micrometer (yA/μm) is obtained. Consequently, the transistor in which a highly purified oxide semiconductor film is used for a channel formation region has much lower off-state current than a transistor containing crystalline silicon.

When an oxide semiconductor film is used as the semiconductor film, the oxide semiconductor preferably contains at least indium (In) or zinc (Zn). Furthermore, as a stabilizer for reducing variations in electric characteristics of transistors using the oxide semiconductor, the oxide semiconductor preferably contains gallium (Ga), tin (Sn), hafnium (Hf), aluminum (Al), and/or zirconium (Zr) in addition to indium (In) and/or zinc (Zn).

An In—Ga—Zn oxide and an In—Sn—Zn oxide among oxide semiconductors have the following advantages over silicon carbide, gallium nitride, and gallium oxide: transistors with excellent electrical characteristics can be formed by sputtering or a wet process and thus can be mass-produced easily. Moreover, unlike in the case of using silicon carbide, gallium nitride, or gallium oxide, with the use of the In—Ga—Zn oxide, transistors with excellent electrical characteristics can be formed over a glass substrate, and a larger substrate can be used.

As another stabilizer, the oxide semiconductor may contain one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

As the oxide semiconductor, any of the following oxides can be used, for example: indium oxide, gallium oxide, tin oxide, zinc oxide, In—Zn oxide, Sn—Zn oxide, Al—Zn oxide, Zn—Mg oxide, Sn—Mg oxide, In—Mg oxide, In—Ga oxide, In—Ga—Zn oxide (also referred to as IGZO), In—Al—Zn oxide, In—Sn—Zn oxide, Sn—Ga—Zn oxide, Al—Ga—Zn oxide, Sn—Al—Zn oxide, In—Hf—Zn oxide, In—La—Zn oxide, In—Pr—Zn oxide, In—Nd—Zn oxide, In—Ce—Zn oxide, In—Sm—Zn oxide, In—Eu—Zn oxide, In—Gd—Zn oxide, In—Tb—Zn oxide, In—Dy—Zn oxide, In—Ho—Zn oxide, In—Er—Zn oxide, In—Tm—Zn oxide, In—Yb—Zn oxide, In—Lu—Zn oxide, In—Sn—Ga—Zn oxide, In—Hf—Ga—Zn oxide, In—Al—Ga—Zn oxide, In—Sn—Al—Zn oxide, In—Sn—Hf—Zn oxide, and In—Hf—Al—Zn oxide.

For example, an In—Ga—Zn oxide refers to an oxide containing In, Ga, and Zn, and there is no limitation on the ratio of In, Ga, and Zn. Furthermore, the In—Ga—Zn oxide may contain a metal element other than In, Ga, and Zn. The In—Ga—Zn oxide has sufficiently high resistance when no electric field is applied thereto, so that off-state current can be sufficiently reduced. Moreover, the In—Ga—Zn oxide has high mobility.

For example, high mobility can be obtained relatively easily with an In—Sn—Zn oxide. Meanwhile, when an In—Ga—Zn oxide is used, the mobility can be increased by reduction in the defect density in a bulk.

In the transistor 80, a metal in the source and drain electrodes might extract oxygen from the oxide semiconductor film depending on a conductive material used for the source and drain electrodes. In such a case, a region of the oxide semiconductor film in contact with the source electrode or the drain electrode becomes an n-type region due to the formation of an oxygen vacancy. The n-type region serves as a source region or a drain region, resulting in a decrease in the contact resistance between the oxide semiconductor film and the source electrode or the drain electrode. Thus, the formation of the n-type regions increases the mobility and the on-state current of the transistor 80, leading to high-speed operation of a semiconductor device using the transistor 80.

Note that the extraction of oxygen by a metal in the source and drain electrodes is probably caused when the source and drain electrodes are formed by sputtering or when heat treatment is performed after the formation of the source and drain electrodes. The n-type region is more likely to be formed by forming the source and drain electrodes with the use of a conductive material that is easily bonded to oxygen. Examples of such a conductive material include Al, Cr, Cu, Ta, Ti, Mo, and W.

In the case where the semiconductor film including the stacked oxide semiconductor films is used in the transistor 80, the n-type region preferably extends to the oxide semiconductor film 82*b* serving as a channel region in order that the mobility and on-state current of the transistor 80 can be increased and the semiconductor device can operate at higher speed.

The insulating film 81 preferably has a function of supplying oxygen to the oxide semiconductor films 82*a* to 82*c* by heating. It is preferable that the number of defects in the insulating film 81 be small, and that typically the spin density of g=2.001 due to a dangling bond of silicon be lower than or equal to $1\times10^{18}$ spins/cm$^3$. The spin density is measured by ESR spectroscopy.

The insulating film 81 is preferably formed using an oxide to have a function of supplying oxygen to the oxide semiconductor films 82*a* to 82*c* by heating. Examples of the oxide include aluminum oxide, magnesium oxide, silicon oxide, silicon oxynitride, silicon nitride oxide, gallium oxide, germanium oxide, yttrium oxide, zirconium oxide, lanthanum oxide, neodymium oxide, hafnium oxide, and tantalum oxide. The insulating film 81 can be formed by plasma-enhanced CVD, sputtering, or the like.

Note that in this specification, oxynitride contains more oxygen than nitrogen, and nitride oxide contains more nitrogen than oxygen.

Note that in the transistor 80 illustrated in FIGS. 12A to 12C and FIGS. 13A to 13C, the conductive film 86 overlaps end portions of the oxide semiconductor film 82*b* including a channel region that do not overlap the conductive films 83 and 84, that is, end portions of the oxide semiconductor film 82*b* that are in a region different from regions where the conductive films 83 and 84 are located. If the end portions of the oxide semiconductor film 82*b* are exposed to plasma by etching for forming the end portions, chlorine radical, fluorine radical, or the like generated from an etching gas is easily bonded to a metal element contained in the oxide semiconductor. For this reason, in the end portions of the oxide semiconductor film, oxygen bonded to the metal element is easily released, so that an oxygen vacancy is easily formed and the oxide semiconductor film easily has n-type conductivity. However, in the transistor 80 in FIGS. 12A to 12C and FIGS. 13A to 13C, since the end portions of the oxide semiconductor film 82b that do not overlap the conductive films 83 and 84 overlap with the conductive film 86, an electric field applied to the end portions can be adjusted by controlling the potential of the conductive film 86. Consequently, the flow of current between the conductive films 83 and 84 through the end portions of the oxide semiconductor film 82b can be controlled by the potential supplied to the conductive film 86. This structure of the transistor 80 is referred to as a surrounded channel (s-channel) structure.

Specifically, when a potential at which the transistor 80 is turned off is supplied to the conductive film 86, the s-channel structure can reduce the amount of off-state current that flows between the conductive films 83 and 84 through the end portions of the oxide semiconductor film 82b. For this reason, even when the distance between the conductive films 83 and 84 at the end portions of the oxide semiconductor film 82b is reduced in the transistor 80 as a result of reducing the channel length to obtain high on-state current, the transistor 80 can exhibit low off-state current. Thus, the transistor 80 with a short channel length can exhibit high on-state current and low off-state current.

Specifically, when a potential at which the transistor 80 is turned on is supplied to the conductive film 86, the s-channel structure can increase the amount of current that flows between the conductive films 83 and 84 through the end portions of the oxide semiconductor film 82b. The current contributes to an increase in the field-effect mobility and on-state current of the transistor 80. When the end portions of the oxide semiconductor film 82b overlap with the conductive film 86, carriers flow in a wide region of the oxide semiconductor film 82b without being limited to a region in the vicinity of the interface between the oxide semiconductor film 82b and the insulating film 85, leading to an increase in the amount of carriers that move in the transistor 80. As a result, the on-state current of the transistor 80 is increased, and the field-effect mobility is increased to 10 $cm^2$V·s or higher or to 20 $cm^2$N·s or higher, for example. Note that here, field-effect mobility is not an approximate value of the mobility as the physical property of the oxide semiconductor film, but is an index of current drive capability in a saturation region of the transistor and apparent field-effect mobility A structure of the oxide semiconductor film is described below.

Note that in this specification, the term "parallel" indicates that an angle formed between two straight lines ranges from −10° to 10°, and accordingly also includes the case where the angle ranges from −5° to 5°. The term "substantially parallel" indicates that an angle formed between two straight lines ranges from −30° to 30°. The term "perpendicular" indicates that the angle formed between two straight lines ranges from 80° to 100°, and accordingly also includes the case where the angle ranges from 85° to 95°. The term "substantially perpendicular" indicates that an angle formed between two straight lines ranges from 60° to 120°. In this specification, trigonal and rhombohedral crystal systems are included in a hexagonal crystal system.

An oxide semiconductor film is classified into a non-single-crystal oxide semiconductor film and a single crystal oxide semiconductor film. Alternatively, an oxide semiconductor is classified into a crystalline oxide semiconductor and an amorphous oxide semiconductor, for example.

Examples of a non-single-crystal oxide semiconductor include a c-axis aligned crystalline oxide semiconductor (CAAC-OS), a polycrystalline oxide semiconductor, a microcrystalline oxide semiconductor, and an amorphous oxide semiconductor. Examples of a crystalline oxide semiconductor include a single crystal oxide semiconductor, a CAAC-OS, a polycrystalline oxide semiconductor, and a microcrystalline oxide semiconductor.

First, a CAAC-OS film is described.

The CAAC-OS film is an oxide semiconductor film having a plurality of c-axis aligned crystal parts.

With a transmission electron microscope (TEM), a combined analysis image (high-resolution TEM image) of a bright-field image and a diffraction pattern of the CAAC-OS film is observed, and a plurality of crystal part can be clearly observed. However, in the high-resolution TEM image, a boundary between crystal parts, that is, a grain boundary is not clearly observed. Thus, in the CAAC-OS film, a reduction in electron mobility due to the grain boundary is less likely to occur.

According to the high-resolution cross-sectional TEM image of the CAAC-OS film observed in a direction substantially parallel to a sample surface, metal atoms are arranged in a layered manner in the crystal parts. Each metal atom layer reflects unevenness of a surface over which the CAAC-OS film is formed (hereinafter a surface over which the CAAC-OS film is formed is referred to as a formation surface) or a top surface of the CAAC-OS film, and is arranged parallel to the formation surface or the top surface of the CAAC-OS film.

In the high-resolution plan-view TEM image of the CAAC-OS film observed in a direction substantially perpendicular to the sample surface, metal atoms arranged in a triangular or hexagonal configuration are seen in the crystal parts. However, there is no regularity of arrangement of metal atoms between different crystal parts.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently at a diffraction angle (2θ) of around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

When the CAAC-OS film with an $InGaZnO_4$ crystal is analyzed by an out-of-plane method, a peak may also be observed at 2θ of around 36° as well as at 2θ of around 31°. The peak at 2θ of around 36° indicates that a crystal having no c-axis alignment is included in part of the CAAC-OS film. It is preferable that in the CAAC-OS film, a peak appear at 2θ of around 31° and a peak not appear at 2θ of around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. A heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which the impurity concentration is low and the density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (rarely has normally-on characteristics). The highly purified intrinsic or substantially highly purified intrinsic oxide semiconductor film has a low density of defect states and thus has few carrier traps. Consequently, the transistor including the oxide semiconductor film has little variation in electrical characteristics and high reliability. Electric charge trapped by the carrier traps in the oxide semiconductor film takes a long time to be released and might behave like fixed electric charge. Thus, the transistor including the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Next, a microcrystalline oxide semiconductor film is described.

In a high-resolution TEM image of a microcrystalline oxide semiconductor film, there are a region where a crystal part is observed and a region where a crystal part is not clearly observed. In most cases, a crystal part in the microcrystalline oxide semiconductor ranges from 1 nm to 100 nm, or from 1 nm to 10 nm. A microcrystal with a size in the range of 1 nm to 10 nm or of 1 nm to 3 nm is specifically referred to as nanocrystal (nc). An oxide semiconductor film including nanocrystal is referred to as a nanocrystalline oxide semiconductor (nc-OS) film. In a high-resolution TEM image of the nc-OS film, a grain boundary cannot be found clearly in some cases.

In the nc-OS film, a microscopic region (e.g., a region with a size ranging from 1 nm to 10 nm, in particular, from 1 nm to 3 nm) has a periodic atomic order. There is no regularity of crystal orientation between different crystal parts in the nc-OS film. Thus, the orientation of the whole film is not observed. Consequently, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak showing a crystal plane does not appear. A diffraction pattern like a halo pattern appears in a selected-area electron diffraction pattern of the nc-OS film obtained by using an electron beam having a probe diameter larger than the diameter of a crystal part (e.g., having a probe diameter of 50 nm or larger). Meanwhile, spots are shown in a nanobeam electron diffraction pattern of the nc-OS film obtained by using an electron beam having a probe diameter close to or smaller than the diameter of a crystal part. Furthermore, in a nanobeam electron diffraction pattern of the nc-OS film, regions with high luminance in a circular (ring) pattern are sometimes shown. Also in a nanobeam electron diffraction pattern of the nc-OS film, a plurality of spots are sometimes shown in a ring-like region.

The nc-OS film is an oxide semiconductor film that has higher regularity than an amorphous oxide semiconductor film, and therefore has a lower density of defect states than an amorphous oxide semiconductor film. However, there is no regularity of crystal orientation between different crystal parts in the nc-OS film; hence, the nc-OS film has a higher density of defect states than the CAAC-OS film.

Next, an amorphous oxide semiconductor film is described.

The amorphous oxide semiconductor film has disordered atomic arrangement and no crystal part. An example of the amorphous oxide semiconductor film is an oxide semiconductor film with a non-crystalline state like quartz glass.

In a high-resolution TEM image of the amorphous oxide semiconductor film, crystal parts cannot be found.

When the amorphous oxide semiconductor film is subjected to structural analysis by an out-of-plane method with an XRD apparatus, a peak showing a crystal plane does not appear. A halo pattern is shown in an electron diffraction pattern of the amorphous oxide semiconductor film. Furthermore, a halo pattern is shown but a spot is not shown in a nanobeam electron diffraction pattern of the amorphous oxide semiconductor film.

Note that an oxide semiconductor film may have a structure with physical properties between the nc-OS film and the amorphous oxide semiconductor film. The oxide semiconductor film having such a structure is specifically referred to as an amorphous-like oxide semiconductor (a-like OS) film.

In a high-resolution TEM image of the a-like OS film, a void may be seen. Furthermore, in the high-resolution TEM image, there are a region where a crystal part is clearly observed and a region where a crystal part is not observed. In the a-like OS film, crystallization occurs by a slight amount of electron beam used for TEM observation and growth of the crystal part is found in some cases. In contrast, crystallization due to a slight amount of electron beam used for TEM observation is hardly observed in the nc-OS film having good quality.

Note that the crystal part size in the a-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers of three In—O layers and six Ga—Zn—O layers are layered in the c-axis direction. Thus, the spacing between these adjacent layers is substantially equivalent to the lattice spacing (also referred to as d value) on the (009) plane, and is 0.29 nm according to crystal structure analysis. Consequently, focusing on the lattice fringes in the high-resolution TEM image, lattice fringes with a spacing ranging from 0.28 nm to 0.30 nm each correspond to the a-b plane of the $InGaZnO_4$ crystal.

The density of an oxide semiconductor film might vary depending on its structure. For example, when the composition of an oxide semiconductor film becomes clear, the structure of the oxide semiconductor film can be estimated from a comparison between the density of the oxide semiconductor film and the density of a single crystal oxide semiconductor film having the same composition as the oxide semiconductor film. For instance, the density of an a-like OS film is 78.6% or higher and lower than 92.3% of the density of the single crystal oxide semiconductor film. In addition, for example, the density of an nc-OS film or a CAAC-OS film is 92.3% or higher and lower than 100% of the density of the single crystal oxide semiconductor film. Note that it is difficult to deposit an oxide semiconductor film whose density is lower than 78% of the density of the single crystal oxide semiconductor film.

A specific example of the above is described. For example, in an oxide semiconductor film with an atomic ratio of In:Ga:Zn=1:1:1, the density of single crystal InGaZnO$_4$ with a rhombohedral crystal structure is 6.357 g/cm$^3$. Thus, for example, the density of an a-like OS film with an atomic ratio of In:Ga:Zn=1:1:1 is higher than or equal to 5.0 g/cm$^3$ and lower than 5.9 g/cm$^3$. Moreover, for example, the density of an nc-OS film or a CAAC-OS film with an atomic ratio of In:Ga:Zn=1:1:1 is higher than or equal to 5.9 g/cm$^3$ and lower than 6.3 g/cm$^3$.

Note that single crystals with the same composition do not exist in some cases. In such a case, by combining single crystals with different compositions at a given proportion, it is possible to calculate a density that corresponds to the density of a single crystal with a desired composition. The density of the single crystal with a desired composition may be calculated using weighted average with respect to the combination ratio of the single crystals with different compositions. Note that it is preferable to combine as few kinds of single crystals as possible for density calculation.

Note that an oxide semiconductor film may be a stacked film including two or more films of an amorphous oxide semiconductor film, an a-like OS film, a microcrystalline oxide semiconductor film, and a CAAC-OS film, for example.

For the deposition of the CAAC-OS film, the following conditions are preferably used.

Decay of the crystal state due to impurities can be prevented by reducing the amount of impurities entering the CAAC-OS film during the deposition, for example, by reducing the concentration of impurities (e.g., hydrogen, water, carbon dioxide, and nitrogen) that exist in a treatment chamber or by reducing the concentration of impurities in a deposition gas. Specifically, a deposition gas with a dew point of −80° C. or lower, preferably −100° C. or lower is used.

By increasing the substrate heating temperature during the deposition, migration of a sputtered particle occurs after the sputtered particle reaches a substrate. Specifically, the substrate heating temperature during the deposition ranges from 100° C. to 740° C., preferably from 200° C. to 500° C. When the substrate heating temperature during the deposition is increased and flat-plate-like or pellet-like sputtered particles reach the substrate, migration occurs on the substrate, and a flat plane of each sputtered particle is attached to the substrate.

It is preferable that the proportion of oxygen in the deposition gas be increased and the power be optimized in order to reduce plasma damage in the deposition. The proportion of oxygen in the deposition gas is 30 vol % or higher, preferably 100 vol %.

As an example of the target, an In—Ga—Zn oxide target is described below.

A polycrystalline In—Ga—Zn oxide target is made by mixing InO$_X$ powder, GaO$_Y$ powder, and ZnO$_Z$ powder in a predetermined molar ratio, applying pressure, and performing heat treatment at a temperature of 1000° C. to 1500° C. Note that X, Y, and Z are each a given positive number. Here, the predetermined molar ratio of InO$_X$ powder to GaO$_Y$ powder and ZnO$_Z$ powder is, for example, 2:2:1, 8:4:3, 3:1:1, 1:1:1, 4:2:3, or 3:1:2. The kinds of powder and the molar ratio for mixing powder can be determined as appropriate depending on the desired target.

Alkali metal is not a constituent element of an oxide semiconductor and thus is an impurity. Likewise, alkaline earth metal is an impurity when the alkaline earth metal is not a constituent element of the oxide semiconductor. When an insulating film in contact with an oxide semiconductor film is an oxide, Na, among the alkali metals, diffuses into the insulating film and becomes Na$^+$. Furthermore, in the oxide semiconductor film, Na cuts or enters a bond between metal and oxygen that are constituent elements of the oxide semiconductor. As a result, the electrical characteristics of the transistor deteriorate, for example, the transistor is placed in a normally-on state because of a negative shift of the threshold voltage or the mobility is decreased. In addition, the characteristics of transistors vary. Specifically, the Na concentration measured by secondary ion mass spectrometry is preferably 5×10$^{16}$/cm$^3$ or lower, more preferably 1×10$^{16}$/cm$^3$ or lower, still more preferably 1×10$^{15}$/cm$^3$ or lower. Similarly, the measured Li concentration is preferably 5×10$^{15}$/cm$^3$ or lower, more preferably 1×10$^{15}$/cm$^3$ or lower. Similarly, the measured K concentration is preferably 5×10$^{15}$/cm$^3$ or lower, more preferably 1×10$^{15}$/cm$^3$ or lower.

In the case where metal oxide containing indium is used, silicon or carbon having higher bond energy with oxygen than indium might cut the bond between indium and oxygen, and an oxygen vacancy may be formed. Accordingly, like alkali metal or alkaline earth metal, silicon or carbon contained in the oxide semiconductor film is likely to cause deterioration of the electric characteristics of the transistor. Thus, the concentrations of silicon and carbon in the oxide semiconductor film are preferably low. Specifically, the C concentration or the Si concentration measured by secondary ion mass spectrometry is preferably 1×10$^{18}$/cm$^3$ or lower. In this case, the deterioration of the electric characteristics of the transistor can be prevented, so that the reliability of a semiconductor device can be improved.

Example of Cross-Sectional Structure of Semiconductor Device

Figure 14:
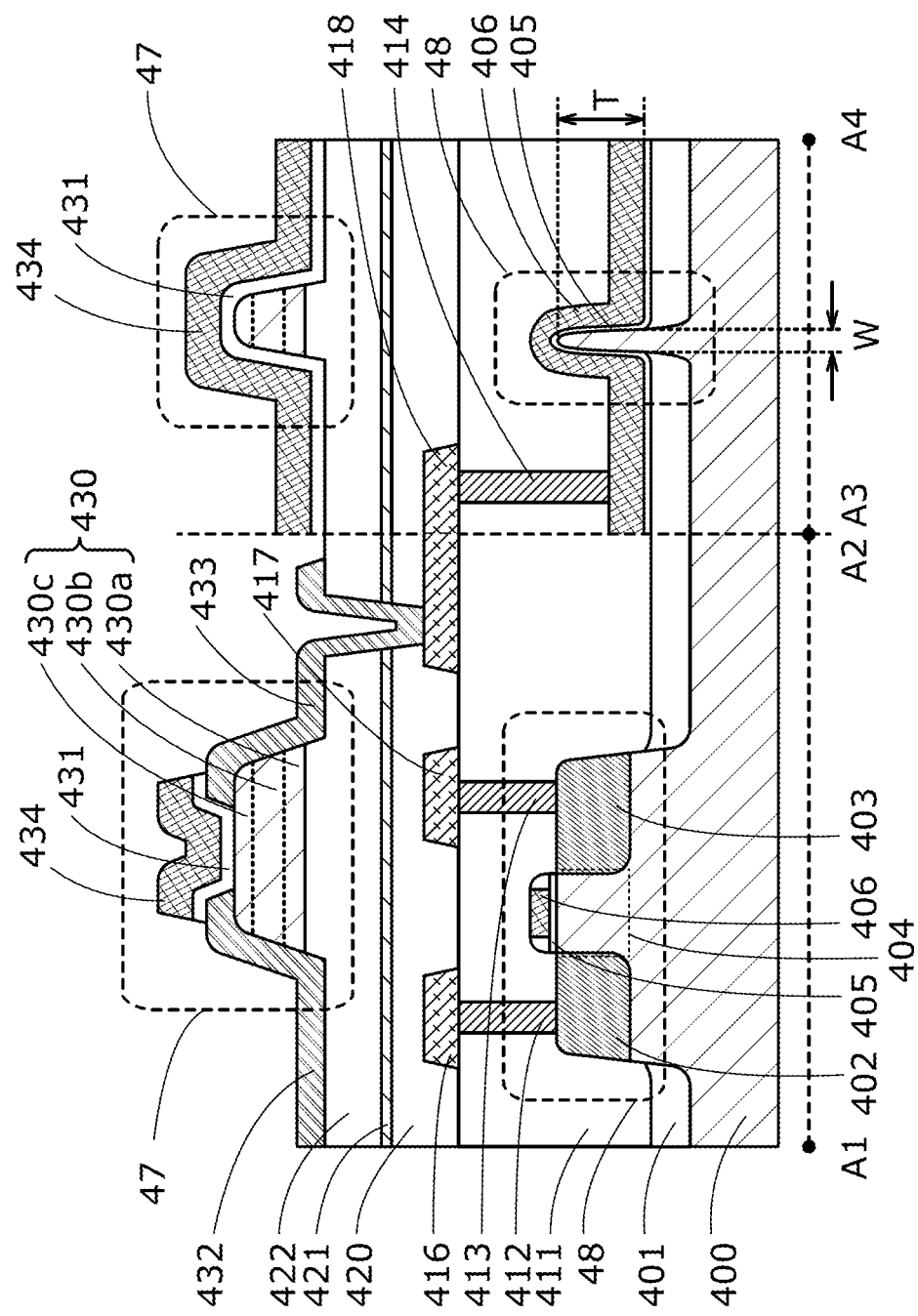
FIG. 14 illustrates a cross-sectional structure of a semiconductor device.

FIG. 14 illustrates an example of a cross-sectional structure of the transistor 47 and the transistor 48 included in the switch circuit 31a illustrated in FIG. 11. A region along the dashed line A1-A2 shows structures of the transistors 47 and 48 in the channel length direction, and a region along the dashed line A3-A4 shows structures of the transistors 47 and 48 in the channel width direction. Note that in one embodiment of the present invention, the channel length direction of the transistor 47 is not necessarily the same as the channel length direction of the transistor 48.

The channel length direction denotes a direction in which carriers move at the shortest distance between a pair of impurity regions serving as a source region and a drain region. The channel width direction denotes a direction perpendicular to the channel length direction in a plane parallel to a substrate.

In FIG. 14, the transistor 47 including a channel formation region in an oxide semiconductor film is formed over the transistor 48 including a channel formation region in a single crystal silicon substrate.

The transistor 48 may include the channel formation region in a semiconductor film or a semiconductor substrate of silicon, germanium, or the like in an amorphous, microcrystalline, polycrystalline, or single crystal state. Alternatively, the transistor 48 may include the channel formation region in an oxide semiconductor film or an oxide semiconductor substrate. In the case where channel formation regions of all the transistors are included in an oxide semiconductor film or an oxide semiconductor substrate, the transistor 47 is not necessarily stacked over the transistor 48, and the transistors 47 and 48 may be formed in the same layer.

When the transistor 48 is formed using a thin silicon film, any of the following can be used, for example: amorphous silicon formed by sputtering or vapor phase growth such as plasma-enhanced CVD; polycrystalline silicon obtained by crystallization of amorphous silicon by laser annealing or the like; and single crystal silicon obtained by separation of a surface portion of a single crystal silicon wafer by implantation of hydrogen ions or the like into the silicon wafer.

A substrate 400 where the transistor 48 is formed can be, for example, a silicon substrate, a germanium substrate, or a silicon germanium substrate. In FIG. 14, a single crystal silicon substrate is used as the substrate 400.

The transistor 48 is electrically isolated by an element isolation method. An example of the element isolation method is a trench isolation method (shallow trench isolation: STI). FIG. 14 illustrates an example where the trench isolation method is used to electrically isolate the transistor 48. Specifically, in FIG. 14, the transistor 48 is electrically isolated by using an element isolation insulating region 401 formed in such a manner that an insulator containing silicon oxide or the like is buried in a trench formed in the substrate 400 by etching or the like and then the insulator is removed partly by etching or the like.

In a projection of the substrate 400 that exists in a region other than the trench, an impurity region 402 and an impurity region 403 of the transistor 48 and a channel formation region 404 placed between the impurity regions 402 and 403 are provided. The transistor 48 also includes an insulating film 405 covering the channel formation region 404 and a gate electrode 406 that overlaps the channel formation region 404 with the insulating film 405 placed therebetween.

In the transistor 48, a side portion and an upper portion of the projection in the channel formation region 404 overlaps with the gate electrode 406 with the insulating film 405 positioned therebetween, so that carriers flow in a wide area (including a side portion and an upper portion of the channel formation region 404). Thus, an area over the substrate occupied by the transistor 48 is reduced, and the number of transferred carriers in the transistor 48 is increased. As a result, the field-effect mobility and on-state current of transistor 48 are increased. Suppose the length of the projection of the channel formation region 404 in the channel width direction (i.e., channel width) is W and the thickness of the projection of the channel formation region 404 is T. When the aspect ratio that corresponds to the ratio of the thickness T to the channel width W is high, a region where carrier flows becomes wider. Thus, the on-state current and field-effect mobility of the transistor 48 can be further increased.

Note that when the transistor 48 is formed using a bulk semiconductor substrate, the aspect ratio is preferably 0.5 or more, further preferably 1 or more.

An insulating film 411 is provided over the transistor 48. Openings are formed in the insulating film 411. A conductive film 412, a conductive film 413, and a conductive film 414 that are electrically connected to the impurity region 402, the impurity region 403, and the gate electrode 406, respectively, are formed in the openings.

The conductive film 412 is electrically connected to a conductive film 416 over the insulating film 411. The conductive film 413 is electrically connected to a conductive film 417 over the insulating film 411. The conductive film 414 is electrically connected to a conductive film 418 over the insulating film 411.

An insulating film 420 is provided over the conductive films 416 to 418. An insulating film 421 having an effect of blocking diffusion of oxygen, hydrogen, and water is provided over the insulating film 420. As the insulating film 421 has higher density and becomes denser or has a fewer dangling bonds and becomes more chemically stable, the insulating film 421 has a higher blocking effect. The insulating film 421 having an effect of blocking diffusion of oxygen, hydrogen, and water can be formed using, for example, aluminum oxide, aluminum oxynitride, gallium oxide, gallium oxynitride, yttrium oxide, yttrium oxynitride, hafnium oxide, or hafnium oxynitride. The insulating film 421 having an effect of blocking diffusion of hydrogen and water can be formed using silicon nitride or silicon nitride oxide, for example.

An insulating film 422 is provided over the insulating film 421. The transistor 47 is provided over the insulating film 422.

The transistor 47 includes, over the insulating film 422, a semiconductor film 430 containing an oxide semiconductor, conductive films 432 and 433 that are electrically connected to the semiconductor film 430 and functions as source and drain electrodes, a gate insulating film 431 covering the semiconductor film 430, and a gate electrode 434 that overlaps the semiconductor film 430 with the gate insulating film 431 positioned therebetween. An opening is formed in the insulating films 420 to 422. The conductive film 433 is connected to the conductive film 418 in the opening.

Note that in FIG. 14, the transistor 47 includes the gate electrode 434 on at least one side of the semiconductor film 430; alternatively, the transistor 47 may also include a gate electrode that overlaps the semiconductor film 430 with the insulating film 422 placed therebetween.

When the transistor 47 includes a pair of gate electrodes, one of the gate electrodes may be supplied with a signal for controlling the on/off state, and the other of the gate electrodes may be supplied with a potential from another element. In this case, potentials with the same level may be supplied to the pair of gate electrodes, or a fixed potential such as a ground potential may be supplied only to the other of the gate electrodes. By controlling the level of a potential supplied to the other of the gate electrodes, the threshold voltage of the transistor can be controlled.

In FIG. 14, the transistor 47 has a single-gate structure where one channel formation region corresponding to one gate electrode 434 is provided. Alternatively, the transistor 47 may have a multi-gate structure where a plurality of gate electrodes electrically connected to each other are provided so that a plurality of channel formation regions are included in one active film.

FIG. 14 illustrates the example in which the semiconductor film 430 in the transistor 47 includes the oxide semiconductor films 430a to 430c that are stacked in this order over the insulating film 422. However, in one embodiment of the present invention, the semiconductor film 430 of the transistor 47 may be a single metal oxide film.

Examples of Electronic Device

The semiconductor device of one embodiment of the present invention can be used for display devices, personal computers, and image reproducing devices provided with recording media (typically, devices that reproduce the content of recording media such as digital versatile discs (DVD) and have displays for displaying the reproduced images). Other examples of electronic devices that can be equipped with the semiconductor device of one embodiment of the present invention are mobile phones, game machines including portable game consoles, portable information appliances, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and medical equipment. FIGS. 15A to 15F illustrate specific examples of such electronic devices.

Figure 15A:
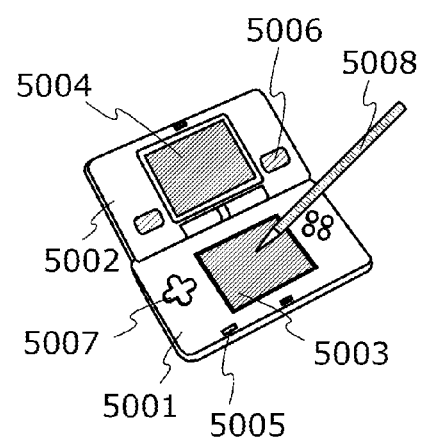
FIGS. 15A to 15F illustrate electronic devices.

FIG. 15A illustrates a portable game console including a housing 5001, a housing 5002, a display portion 5003, a display portion 5004, a microphone 5005, speakers 5006, a control key 5007, a stylus 5008, and the like. The semiconductor device of one embodiment of the present invention can be used for a variety of integrated circuits included in the portable game console. Although the portable game console illustrated in FIG. 15A has the two display portions 5003 and 5004, the number of display portions included in a portable game console is not limited to two.

Figure 15B:
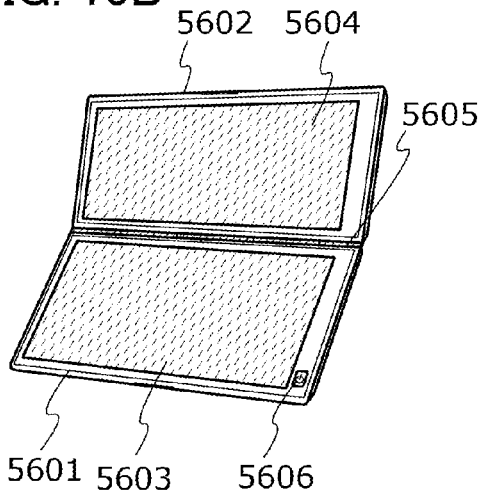

FIG. 15B illustrates a portable information appliance including a first housing 5601, a second housing 5602, a first display portion 5603, a second display portion 5604, a joint 5605, an operation key 5606, and the like. The semiconductor device of one embodiment of the present invention can be used for a variety of integrated circuits included in the portable information appliance. The first display portion 5603 is provided in the first housing 5601, and the second display portion 5604 is provided in the second housing 5602. The first housing 5601 and the second housing 5602 are connected to each other with the joint 5605, and the angle between the first housing 5601 and the second housing 5602 can be changed with the joint 5605. Images displayed on the first display portion 5603 may be switched in accordance with the angle at the joint 5605 between the first housing 5601 and the second housing 5602. A display device with a position input function may be used as at least one of the first display portion 5603 and the second display portion 5604. Note that the position input function can be added by providing a touch panel in a display device or by providing a photoelectric conversion element called a photosensor in a pixel area of a display device.

Figure 15C:
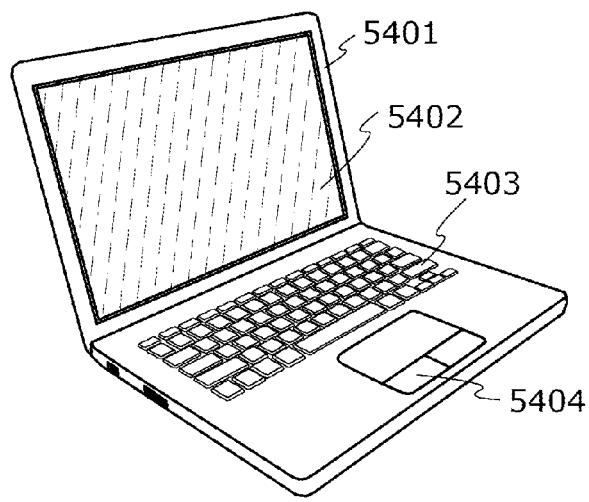

FIG. 15C illustrates a laptop including a housing 5401, a display portion 5402, a keyboard 5403, a pointing device 5404, and the like. The semiconductor device of one embodiment of the present invention can be used for a variety of integrated circuits included in the laptop.

Figure 15D:
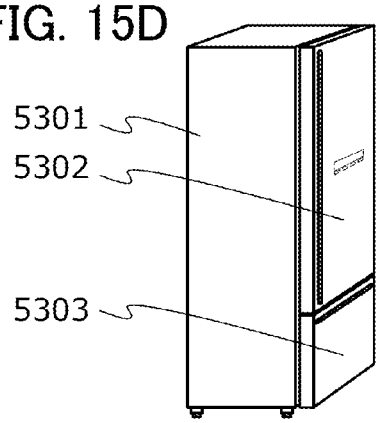

FIG. 15D illustrates an electric refrigerator-freezer including a housing 5301, a refrigerator door 5302, a freezer door 5303, and the like. The semiconductor device of one embodiment of the present invention can be used for a variety of integrated circuits included in the electric refrigerator-freezer.

Figure 15E:
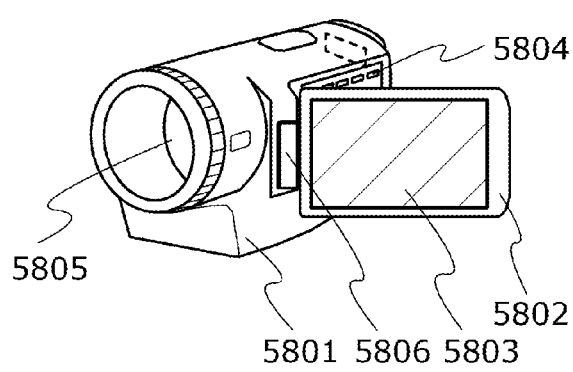

FIG. 15E illustrates a video camera including a first housing 5801, a second housing 5802, a display portion 5803, an operation key 5804, a lens 5805, a joint 5806, and the like. The semiconductor device of one embodiment of the present invention can be used for a variety of integrated circuits included in the video camera. The operation key 5804 and the lens 5805 are provided in the first housing 5801. The display portion 5803 is provided in the second housing 5802. The first housing 5801 and the second housing 5802 are connected to each other with the joint 5806, and the angle between the first housing 5801 and the second housing 5802 can be changed with the joint 5806. Images displayed on the display portion 5803 may be switched in accordance with the angle at the joint 5806 between the first housing 5801 and the second housing 5802.

Figure 15F:
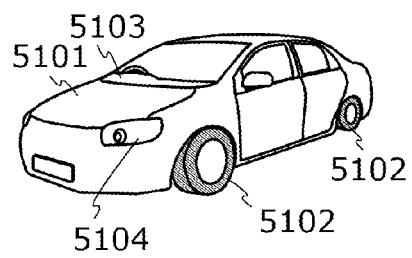

FIG. 15F illustrates a passenger car including a car body 5101, wheels 5102, a dashboard 5103, lights 5104, and the like. The semiconductor device of one embodiment of the present invention can be used for a variety of integrated circuits included in the passenger car.

This application is based on Japanese Patent Application serial no. 2013-241608 filed with Japan Patent Office on Nov. 22, 2013, the entire contents of which are hereby incorporated by reference.

What is claimed is:

1. A semiconductor device comprising:
   a first circuit comprising a first memory; and
   a second circuit comprising a second memory and a logic array,
   wherein the comprises a first memory is configured to store first data corresponding to a history of a first branch instruction of the first circuit, and
   wherein the second memory is configured to store second data for controlling electrical continuity between circuits in the logic array and an output signal with respect to an input signal of the circuits in the logic array to generate a signal for testing an operating state of the first circuit in a test for the operating state of the first circuit, and third data corresponding to a history of a second branch instruction of the first circuit in normal operation after the test.

2. The semiconductor device according to claim 1,
   wherein the second memory comprises a first transistor and a second transistor, and
   wherein a first terminal of the first transistor is electrically connected to a gate of the second transistor.

3. The semiconductor device according to claim 1,
   wherein the second memory comprises a first transistor and a second transistor,
   wherein a first terminal of the first transistor is electrically connected to a gate of the second transistor, and
   wherein an on/off state of the second transistor is selected according to the second data input through the first transistor.

4. The semiconductor device according to claim 1,
   wherein the second memory comprises a first transistor and a second transistor,
   wherein a first terminal of the first transistor is electrically connected to a gate of the second transistor, and
   wherein the first transistor comprises a channel formation region comprising an oxide semiconductor.

5. The semiconductor device according to claim 1,
   wherein the second memory comprises a first transistor and a second transistor,
   wherein a first terminal of the first transistor is electrically connected to a gate of the second transistor,
   wherein an on/off state of the second transistor is selected according to the second data input through the first transistor, and
   wherein the first transistor comprises a channel formation region comprising an oxide semiconductor.

6. The semiconductor device according to claim 1,
   wherein the second memory comprises a first transistor and a second transistor, wherein a first terminal of the first transistor is electrically connected to a gate of the second transistor,
wherein the first transistor comprises a channel formation region comprising an oxide semiconductor, and
wherein the oxide semiconductor comprises at least one of In, Ga, and Zn.

7. The semiconductor device according to claim 1,
wherein the second memory comprises a first transistor and a second transistor,
wherein a first terminal of the first transistor is electrically connected to a gate of the second transistor,
wherein an on/off state of the second transistor is selected according to the second data input through the first transistor,
wherein the first transistor comprises a channel formation region comprising an oxide semiconductor, and
wherein the oxide semiconductor comprises at least one of In, Ga, and Zn.

8. A semiconductor device comprising:
a first circuit comprising a first memory; and
a second circuit comprising a second memory and a logic array,
wherein the first memory is configured to store first data corresponding to a history of a first branch instruction of the first circuit and a first address of the first branch instruction and a comparator circuit comparing an address of an instruction and the first address, and
wherein the second memory is configured to store second data for controlling electrical continuity between circuits in the logic array and an output signal with respect to an input signal of the circuits in the logic array to generate a signal for testing an operating state of the first circuit in a test for the operating state of the first circuit, and third data corresponding to a history of a second branch instruction of the first circuit and a second address of the second branch instruction in normal operation after the test.

9. The semiconductor device according to claim 8,
wherein the second memory comprises a first transistor and a second transistor, and
wherein a first terminal of the first transistor is electrically connected to a gate of the second transistor.

10. The semiconductor device according to claim 8,
wherein the second memory comprises a first transistor and a second transistor,
wherein a first terminal of the first transistor is electrically connected to a gate of the second transistor, and
wherein an on/off state of the second transistor is selected according to the second data input through the first transistor.

11. The semiconductor device according to claim 8,
wherein the second memory comprises a first transistor and a second transistor,
wherein a first terminal of the first transistor is electrically connected to a gate of the second transistor, and
wherein the first transistor comprises a channel formation region comprising an oxide semiconductor.

12. The semiconductor device according to claim 8,
wherein the second memory comprises a first transistor and a second transistor,
wherein a first terminal of the first transistor is electrically connected to a gate of the second transistor,
wherein an on/off state of the second transistor is selected according to the second data input through the first transistor, and
wherein the first transistor comprises a channel formation region comprising an oxide semiconductor.

13. The semiconductor device according to claim 8,
wherein the second memory comprises a first transistor and a second transistor,
wherein a first terminal of the first transistor is electrically connected to a gate of the second transistor,
wherein the first transistor comprises a channel formation region comprising an oxide semiconductor, and
wherein the oxide semiconductor comprises at least one of In, Ga, and Zn.

14. The semiconductor device according to claim 8,
wherein the second memory comprises a first transistor and a second transistor,
wherein a first terminal of the first transistor is electrically connected to a gate of the second transistor,
wherein an on/off state of the second transistor is selected according to the second data input through the first transistor,
wherein the first transistor comprises a channel formation region comprising an oxide semiconductor, and
wherein the oxide semiconductor comprises at least one of In, Ga, and Zn.

15. A semiconductor device comprising:
a first circuit comprising a first memory; and
a second circuit comprising a second memory and a logic array,
wherein the first memory is configured to store first data corresponding to a history of a first branch instruction of the first circuit and a first address of the first branch instruction, a comparator circuit comparing an address of an instruction and the first address, and a selector circuit selecting the first address in accordance with a comparison result of the comparator circuit, and
wherein the second memory is configured to store second data for controlling electrical continuity between circuits in the logic array and an output signal with respect to an input signal of the circuits in the logic array to generate a signal for testing an operating state of the first circuit in a test for the operating state of the first circuit, and third data corresponding to a history of a second branch instruction of the first circuit and a second address of the second branch instruction in normal operation after the test.

16. The semiconductor device according to claim 15,
wherein the second memory comprises a first transistor and a second transistor, and
wherein a first terminal of the first transistor is electrically connected to a gate of the second transistor.

17. The semiconductor device according to claim 15,
wherein the second memory comprises a first transistor and a second transistor,
wherein a first terminal of the first transistor is electrically connected to a gate of the second transistor, and
wherein an on/off state of the second transistor is selected according to the second data input through the first transistor.

18. The semiconductor device according to claim 15,
wherein the second memory comprises a first transistor and a second transistor,
wherein a first terminal of the first transistor is electrically connected to a gate of the second transistor, and
wherein the first transistor comprises a channel formation region comprising an oxide semiconductor.

19. The semiconductor device according to claim 15,
wherein the second memory comprises a first transistor and a second transistor,
wherein a first terminal of the first transistor is electrically connected to a gate of the second transistor, wherein an on/off state of the second transistor is selected according to the second data input through the first transistor, and wherein the first transistor comprises a channel formation region comprising an oxide semiconductor.

20. The semiconductor device according to claim 15, wherein the second memory comprises a first transistor and a second transistor, wherein a first terminal of the first transistor is electrically connected to a gate of the second transistor, wherein the first transistor comprises a channel formation region comprising an oxide semiconductor, and wherein the oxide semiconductor comprises at least one of In, Ga, and Zn.

21. The semiconductor device according to claim 15, wherein the second memory comprises a first transistor and a second transistor, wherein a first terminal of the first transistor is electrically connected to a gate of the second transistor, wherein an on/off state of the second transistor is selected according to the second data input through the first transistor, wherein the first transistor comprises a channel formation region comprising an oxide semiconductor, and wherein the oxide semiconductor comprises at least one of In, Ga, and Zn.

\* \* \* \* \*

UNITED STATES PATENT AND TRADEMARK OFFICE
CERTIFICATE OF CORRECTION

PATENT NO. : 9,494,644 B2  
APPLICATION NO. : 14/542859  
DATED : November 15, 2016  
INVENTOR(S) : Yoshiyuki Kurokawa Page 1 of 1

It is certified that error appears in the above-identified patent and that said Letters Patent is hereby corrected as shown below:

In the Specification

Column 9, Line 58, replace "NIT" with --INIT--;

Column 9, Line 60, replace "NIT" with --INIT--;

Column 15, Line 38, replace "they" with --the y--;

Column 16, Line 18, replace "NIT" with --INIT--;

Column 21, Line 8, after "$1\times10^{-13}$" insert --A--;

Column 23, Line 47, replace "$cm^2 V \cdot s$" with --$cm^2/V \cdot s$--;

Column 23, Line 47, replace ""$cm^2 N \cdot s$" with --$cm^2/V \cdot s$--; and

In the Claims

Column 32, Line 23, in Claim 1, after "wherein the" delete "comprises a".

Signed and Sealed this  
Eighteenth Day of April, 2017

Michelle K. Lee  
*Director of the United States Patent and Trademark Office*